(12) United States Patent
Sasaki et al.

(10) Patent No.: US 8,361,817 B2
(45) Date of Patent: Jan. 29, 2013

(54) METHOD FOR MANUFACTURING SURFACE-EMITTING LASER DEVICE, OPTICAL SCANNER, IMAGE FORMING APPARATUS, AND OXIDATION APPARATUS

(75) Inventors: Toshihide Sasaki, Miyagi (JP); Akihiro Itoh, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 168 days.

(21) Appl. No.: 12/796,217

(22) Filed: Jun. 8, 2010

(65) Prior Publication Data
US 2010/0311194 A1   Dec. 9, 2010

(30) Foreign Application Priority Data

Jun. 9, 2009  (JP) ................................. 2009-137792
Feb. 9, 2010  (JP) ................................. 2010-026030

(51) Int. Cl.
*H01L 21/00*   (2006.01)
(52) U.S. Cl. .................................. 438/29; 257/E21.211
(58) Field of Classification Search .................... 438/29; 257/E29.211, E21.211
See application file for complete search history.

(56) References Cited

U.S. PATENT DOCUMENTS

| 5,493,577 A | 2/1996 | Choquette et al. |
| 6,674,785 B2 | 1/2004 | Sato et al. |
| 6,765,232 B2 | 7/2004 | Takahashi et al. |
| 6,975,663 B2 | 12/2005 | Sekiya et al. |
| 2002/0037616 A1* | 3/2002 | Fujita ............................ 438/248 |
| 2008/0212636 A1 | 9/2008 | Sato et al. |
| 2008/0233017 A1 | 9/2008 | Sato et al. |
| 2009/0262770 A1 | 10/2009 | Itoh et al. |
| 2009/0295902 A1 | 12/2009 | Sato et al. |
| 2009/0303308 A1 | 12/2009 | Itoh et al. |
| 2010/0060712 A1 | 3/2010 | Sato et al. |

FOREIGN PATENT DOCUMENTS

| JP | 62-004315 | 1/1987 |
| JP | 62-262417 | 11/1987 |
| JP | 2006-228811 | 8/2006 |
| JP | 2006-303415 | 11/2006 |

OTHER PUBLICATIONS

Choquette K D et al. (1997) "Advances in Selective Wet Oxidization of AlGaAs Alloys," IEEE Journal of Selected Topics in Quantum Electronics, vol. 3, No. 3.

\* cited by examiner

*Primary Examiner* — Matthew Reames
(74) *Attorney, Agent, or Firm* — Cooper & Dunham LLP

(57) ABSTRACT

Disclosed is a method for manufacturing a surface-emitting laser device that emits laser light in a direction perpendicular to a substrate. The method includes manufacturing a laminated body in which a lower reflecting mirror, a resonator structure including an active layer, and an upper reflecting mirror including a selectively oxidized layer are laminated on the substrate; etching the laminated body from an upper surface to form a mesa structure having at least the selectively oxidized layer exposed at a side surface; and mounting the laminated body on a tray having a front surface shaped to follow a warpage of the laminated body at an oxidation temperature and selectively oxidizing the selectively oxidized layer from the side surface of the mesa structure, thereby generating a confinement structure in which a current passing region is surrounded by an oxide.

7 Claims, 27 Drawing Sheets

FIG.5
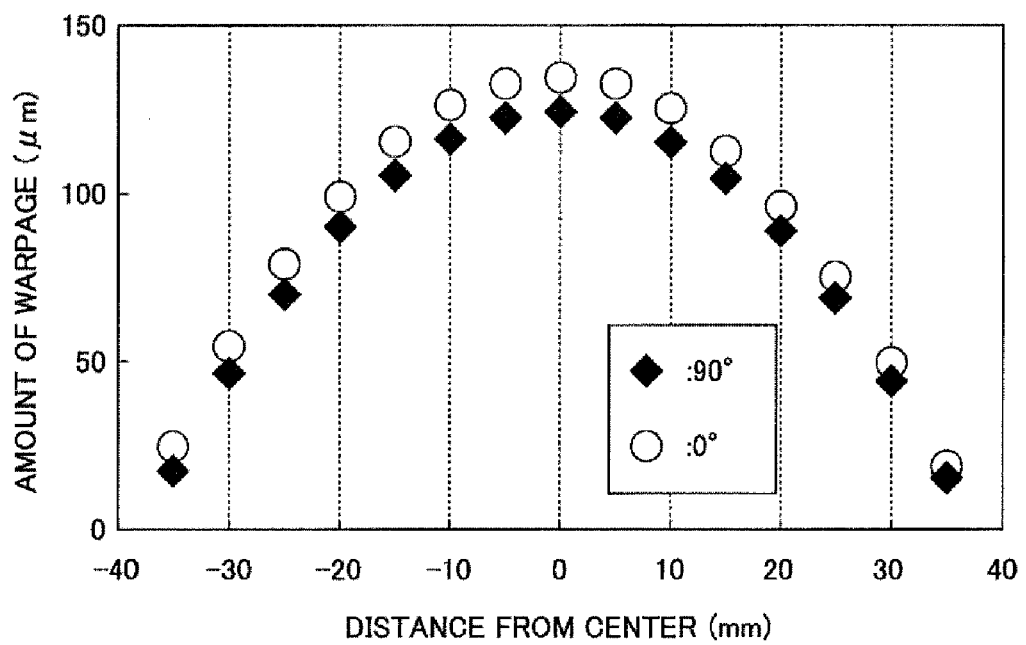
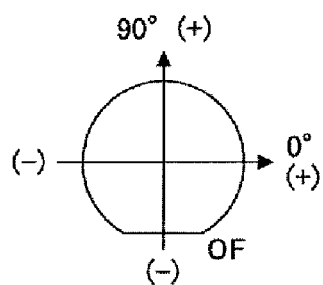

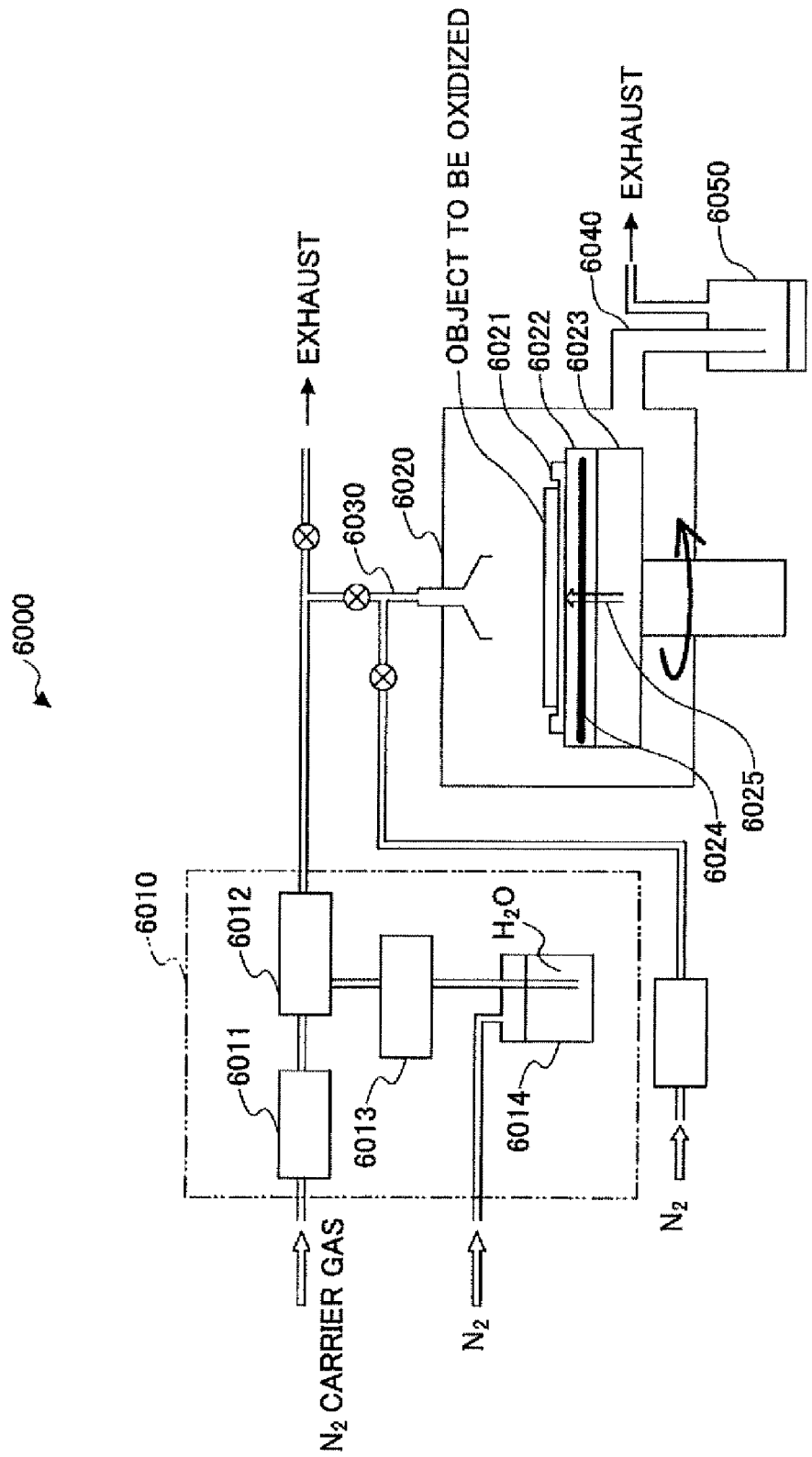

| TRAY | DIFFERENCE IN OXIDATION RATE INSIDE PLANE |
|---|---|
| 6021 | 0.015 μm/min |
| 6021A | 0.030 μm/min |
| 6021G | 0.080 μm/min |

METHOD FOR MANUFACTURING SURFACE-EMITTING LASER DEVICE, OPTICAL SCANNER, IMAGE FORMING APPARATUS, AND OXIDATION APPARATUS

BACKGROUND OF THE INVENTION

1. Field of the Invention

The present invention relates to methods for manufacturing surface-emitting laser devices, optical scanners, image forming apparatuses, and oxidation apparatuses; and more specifically, to a method for manufacturing a surface-emitting laser device that emits laser light in a direction perpendicular to a substrate, an optical scanner having the surface-emitting laser device manufactured by the method, an image forming apparatus having the optical scanner, and an oxidation apparatus that uses vapor to oxidize an object.

2. Description of the Related Art

A vertical cavity surface-emitting laser (VCSEL) device emits laser light in a direction perpendicular to a substrate, and has received attention due to its competitive price, low power consumption, small size, compatibility with two-dimensional devices, and high performance when compared with an end-surface-emitting semiconductor laser device that emits laser light in a direction parallel to a substrate.

A surface-emitting laser device is applied to the optical source (having an oscillation wavelength of a 780 nm band) of an optical writing system in a printer, a writing optical source (having an oscillation wavelength of a 780 nm band and an oscillation wavelength of a 850 nm band) in an optical disk device, and the optical source (having an oscillation wavelength of a 1.3 μm band and an oscillation wavelength of a 1.5 μm band) of an optical transmission system such as a LAN (Local Area Network) using optical fibers. Moreover, the surface-emitting laser device is expected to serve as a light source for transmitting laser light between substrates, inside a substrate, between the chips of a large scale integrated circuit, and inside the chip of a large scale integrated circuit.

The surface-emitting laser device has a confinement structure so as to improve a current inflow efficiency. For example, the confinement structure (hereinafter also referred to as an "oxidized confinement structure" for convenience sake) (see, for example, Patent Document 1) obtained by selectively oxidizing an Al (aluminum) As (arsenic) layer is generally used. The oxidized confinement structure is manufactured in the following manner. That is, a predetermined size of a mesa having a selectively oxidized layer made of p-AlAs exposed at its side surface is formed and then placed in a high-temperature vapor atmosphere to selectively oxidize Al from the side surface of the mesa. With the oxidation of the Al, a non-oxidized region is formed in the selective oxidized layer near the center of the mesa. The non-oxidized region is a region (current passing region) through which the driving current of the surface-emitting device passes.

The refractive index of the layer where Al is oxidized ($Al_xO_y$) in the oxidized confinement structure (hereinafter briefly described as an "oxidized layer") is about 1.6, which is smaller than that of a semiconductor layer. Accordingly, since a refractive-index difference in a transverse direction occurs in a resonator structure and light is trapped at the center of the mesa, light-emitting efficiency can be improved. As a result, excellent characteristics such as a low threshold current and high efficiency can be realized.

Meanwhile, an oxidation rate in the selectively oxidized layer containing Al correlates with the thickness of the selectively oxidized layer and the compositions of Al and As (see, for example, Non-Patent Document 1), and is extremely susceptible to an oxidation temperature, vapor concentration, etc.

Further, due to a slight difference in the compositions and the thickness of the selectively oxidized layer, the size of the current passing region is varied among objects to be oxidized even in the same oxidation time. In addition, plural mesas are generally formed in the object to be oxidized, and the size of the current passing region is varied even with the same object to be oxidized due to the mesas. The variations in the size of the current passing region cause variations in an oscillation characteristic (such as an optical output), which in turn directly leads to the reduction of yields.

Particularly, the area of the current passing region in a single-mode device is smaller than that of the current passing region in a multi-mode device. Therefore, variations in the size of the current passing region largely affect variations in the characteristic of the device. In addition, if the area of the current passing region becomes larger than a desired area, the one which should serve as the single-mode device shows the behavior of the multi-mode device.

In view of this, a method for making uniform the oxidation amount of an object to be oxidized and appropriately controlling an oxidation amount among objects to be oxidized has been achieved (see, for example, Patent Document 2) using a semiconductor oxidation apparatus that has a heating stage for heating the object to be oxidized and a vapor supply unit for oxidizing a selectively oxidized layer in a sealed vessel.

Further, a method for performing an oxidation step on one object to be oxidized plural times to absorb a difference in oxidation rates due to the differences in the compositions and the thicknesses of selectively oxidized layers has been known (see, for example, Patent Document 3).

Further, Patent Document 4 discloses a susceptor for a vapor-phase growth apparatus that has grooves at its front surface to form the receiving portion of a semiconductor substrate and coats the front surface of the semiconductor substrate with a film by vapor-phase growth under high temperature. In the susceptor, the bottom surface of the receiving portion is formed into a convex shape, and a part of the bottom surface is provided with a projection for supporting the semiconductor substrate.

Further, Patent Document 5 discloses a susceptor for vapor-phase growth of a vapor-phase growth apparatus with respect to a semiconductor substrate having a crystal orientation (100), wherein the bottom surface of the spot facing of the susceptor on which the semiconductor substrate is mounted is formed into a convex sphere or a convex cone.

Meanwhile, when a thin film is being grown on a substrate by, for example, a metal organic chemical vapor deposition (MOCVD) method, the temperature (growth temperature) of the substrate is in the range of about 500 through 800° C. After the growth of the thin film, the substrate is cooled to room temperature. Here, since the thin film is grown on the substrate with excellent lattice matching, warpage corresponding to a difference in the coefficients of thermal expansion between the substrate and the thin film is caused in an object to be oxidized as shown in FIG. 1. At this time, the amount of warpage at the center of the object to be oxidized could be as large as 100 through 200 μm.

In a conventional semiconductor oxidation apparatus, inventors placed an object to be oxidized on a heating stage through a flat sample tray to oxidize a selectively oxidized layer, and found a relationship between the amount of warpage at the center of the object to be oxidized and the oxidation rate of the selectively oxidized layer. FIG. 2 is a graph showing the relationship. As shown in FIG. 2, the amount of warpage of the object to be oxidized correlates with the oxidation rate, indicating that the amount of warpage of the object to be oxidized largely affects the oxidation rate.

Further, the inventors found a relationship between a distance from the center of an object to be oxidized and the amount of warpage of the object to be oxidized having warpage of about 130 μm at its center. FIG. 3 is a graph showing the relationship. In addition, FIG. 4 is a graph showing a relationship between the distance from the center of the object to be oxidized and the oxidation rate of the selectively oxidized layer when the object to be oxidized was placed on a heating stage through a flat sample tray to oxidize the selectively oxidized layer in a conventional oxidation apparatus. In this case, the oxidation rate at the center of the object to be oxidized is slower than that at the periphery, which in turn leads to variations in the size of the current passing region of the object to be oxidized. As a result, a manufacturing yield is reduced.

Moreover, the object to be oxidized may not uniformly warp such that it would have been symmetrical about the center of the object to be oxidized in outward directions, but may warp nonuniformly in outward directions. FIG. 5 is a graph showing an example of a relationship between the distance from the center of an object to be oxidized and the amount of warpage in the 0° direction and the 90° direction. Here, a difference in the amount of warpage is confirmed between the 0° direction and the 90° direction. Note that the definitions of the 0° direction and the 90° direction are explained in FIG. 5.

When an object to be oxidized having such a nonuniform warp amount in a plane was oxidized in the process of manufacturing a surface-emitting laser device, it was confirmed that the distribution of the areas of current passing regions is different depending on the directions as shown in FIG. 6. As shown in FIG. 6, the distribution of the areas of the current passing regions is uniform in the 0° direction but nonuniform in the 90° direction. This indicates that the distribution of temperatures in the oxidation process is nonuniform in the 90° direction. The difference in the areas leads to variations in area of the current passing region of the object to be oxidized. As a result, the manufacturing yield of the surface-emitting laser device is reduced.

Thus, the inventors have obtained knowledge that the warpage of an object to be oxidized is one of the factors causing variations in the current passing region other than the composition and the thickness of a selectively oxidized layer.
Patent Document 1: U.S. Pat. No. 5,493,577
Patent Document 2: JP-A-2006-228811
Patent Document 3: JP-A-2006-303415
Patent Document 4: JP-A-62-4315
Patent Document 5: JP-A-62-262417
Non-Patent Document 1: "Advances in Selective Wet Oxidation of AlGaAs Alloys," by Kent D. Choquette et. al., IEEE Journal of Selected Topics in Quantum Electronics, Vol. 3, No. 3, pp. 916-926, 1997

SUMMARY OF THE INVENTION

The present invention has been made based on the knowledge the inventors have thus obtained and has the following configurations.

According to a first aspect of the present invention, there is provided a method for manufacturing a surface-emitting laser device that emits laser light in a direction perpendicular to a substrate. The method includes manufacturing a laminated body in which a lower reflecting mirror, a resonator structure including an active layer, and an upper reflecting mirror including a selectively oxidized layer are laminated on the substrate; etching the laminated body from an upper surface thereof to form a mesa structure having at least the selectively oxidized layer exposed at a side surface thereof; and mounting the laminated body on a tray having a front surface thereof shaped to follow a warpage of the laminated body at an oxidation temperature and selectively oxidizing the selectively oxidized layer from the side surface of the mesa structure, thereby generating a confinement structure in which a current passing region is surrounded by an oxide.

With this configuration, it is possible to improve manufacturing yield.

According to a second aspect of the present invention, there is provided an optical scanner that optically scans a surface to be scanned. The scanner includes a light source having a surface-emitting laser device manufactured by the method described above; a deflector that deflects light emitted from the light source; and a scanning optical system that condenses the light deflected by the deflector onto the surface to be scanned.

With this configuration, it is possible to perform high-precision optical scanning without incurring high cost.

According to a third aspect of the present invention, there is provided an image forming apparatus including at least one image carrier; and the optical scanner described above that scans the at least one image carrier with light modulated in accordance with image information.

With this configuration, it is possible to form a high-quality image without incurring high cost since the image forming apparatus has the optical scanner according to an embodiment of the present invention.

According to a fourth aspect of the present invention, there is provided an oxidation apparatus that uses vapor to oxidize a plate-like object mounted on a heating stage through a tray, wherein a front surface of the tray is shaped to follow a warpage of the object at an oxidation temperature.

With this configuration, it is possible to reduce variations in an oxidation degree in the object.

Other objects, features and advantages of the present invention will become more apparent from the following detailed description when read in conjunction with the accompanying drawings.

BRIEF DESCRIPTION OF THE DRAWINGS

FIG. 5 is a graph for explaining a relationship between the distance from the center of the object to be oxidized and the amount of warpage;

FIG. 11 is a diagram for explaining the schematic configuration of an oxidation apparatus according to the embodiment of the present invention;

DETAILED DESCRIPTION OF THE PREFERRED EMBODIMENTS

Figure 1:
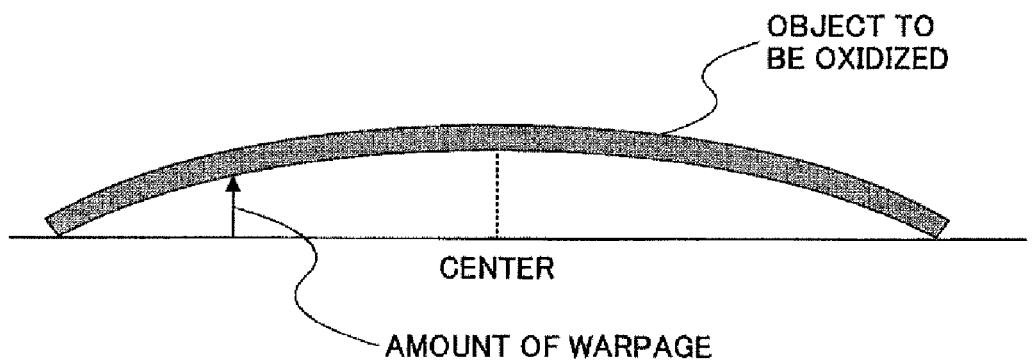
FIG. 1 is a diagram for explaining the amount of warpage of an object to be oxidized.
Figure 2:
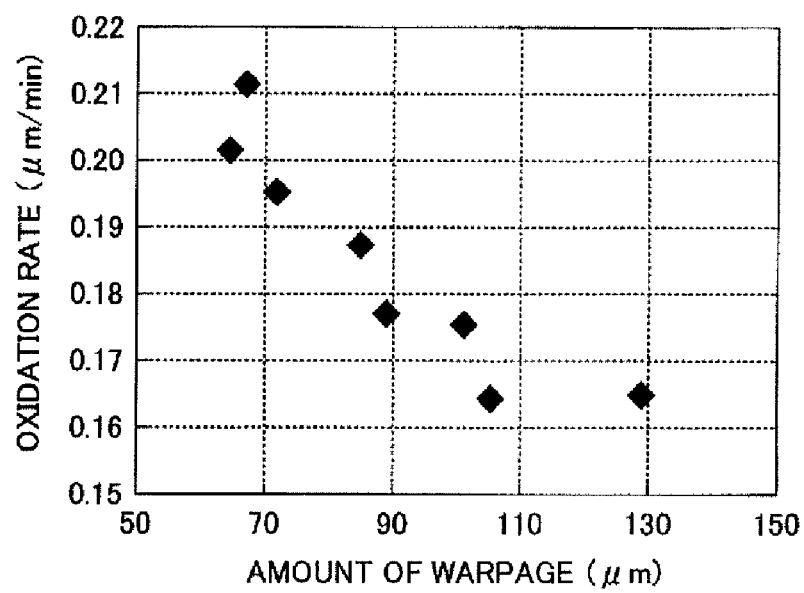
FIG. 2 is a graph for explaining a relationship between the amount of warpage at the central part of the object to be oxidized and the oxidation rate of a selectively oxidized layer.
Figure 3:
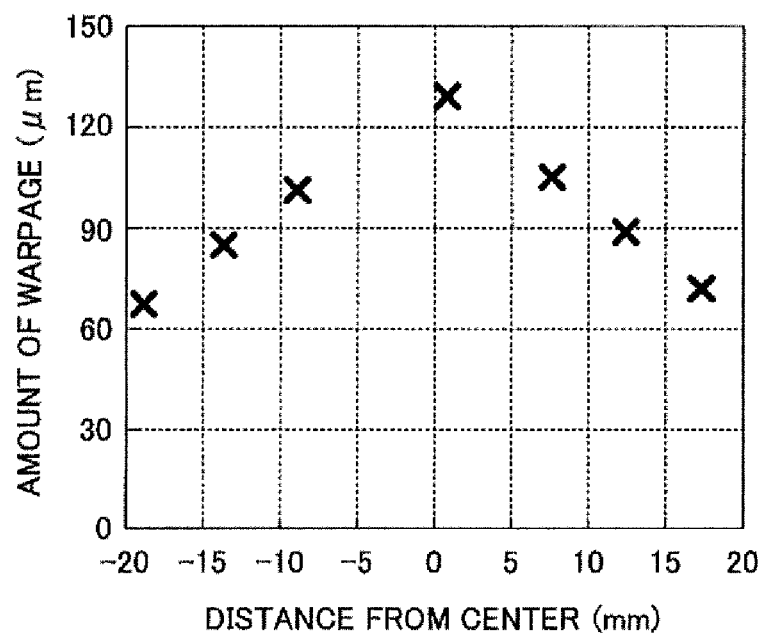
FIG. 3 is a graph for explaining a relationship between a distance from the center of the object to be oxidized and the amount of warpage.
Figure 4:
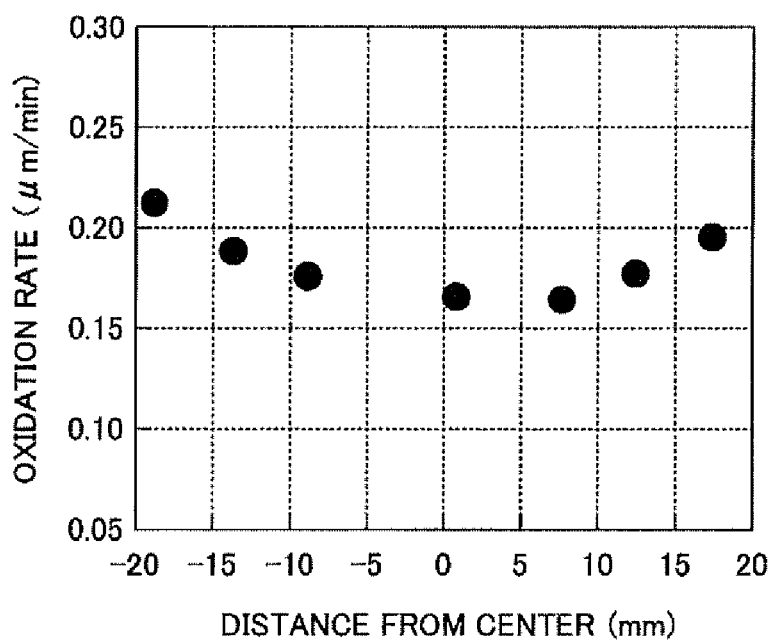
FIG. 4 is a graph for explaining a relationship between the distance from the center of the object to be oxidized and the oxidation rate of the selectively oxidized layer.
Figure 6:
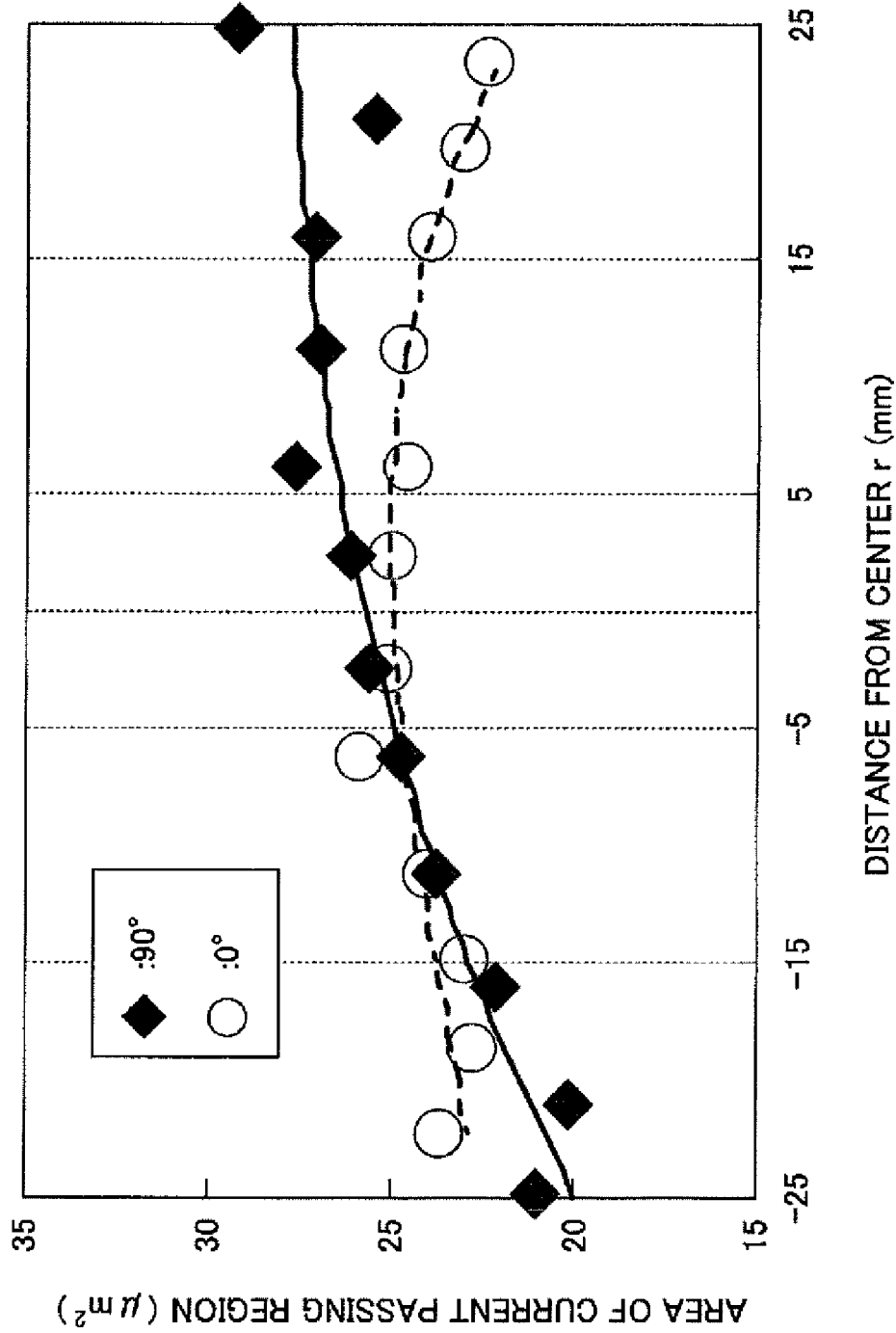
FIG. 6 is a graph for explaining a relationship between the distance from the center of the object to be oxidized and the area of a current passing region.
Figure 7:
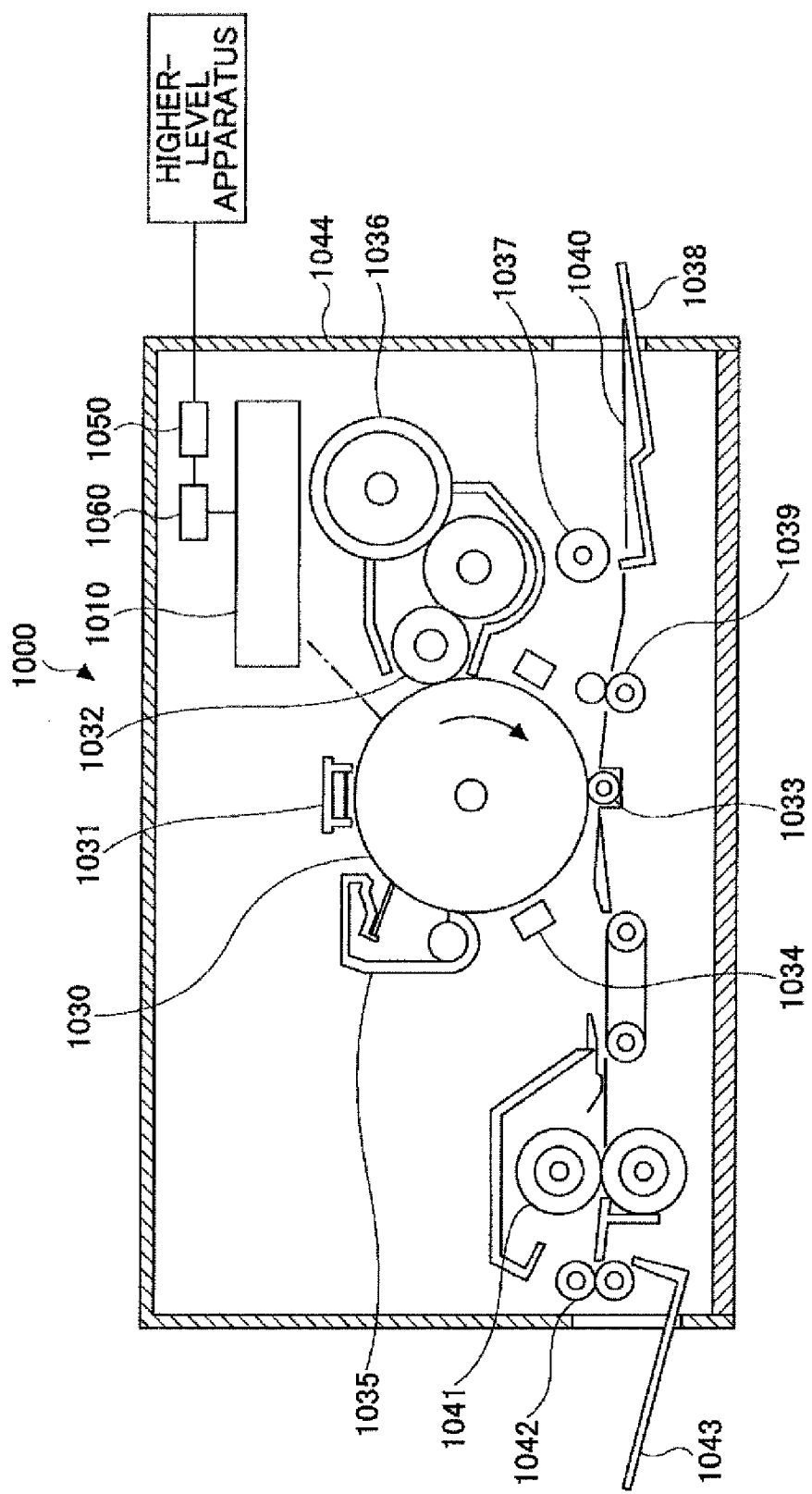
FIG. 7 is a diagram for explaining the schematic configuration of a laser printer according to an embodiment of the present invention.

Next, an embodiment of the present invention is described below with reference to FIGS. 7 through 20. FIG. 7 shows the schematic configuration of a laser printer 1000 according to the embodiment.

The laser printer 1000 has an optical scanner 1010, a photosensitive drum 1030, an electrifying charger 1031, a developing roller 1032, a transfer charger 1033, a charge removing unit 1034, a cleaning unit 1035, a toner cartridge 1036, a sheet feeding roller 1037, a sheet feeding tray 1038, a pair of resist rollers 1039, a fixing roller 1041, a sheet discharging roller 1042, a sheet catching tray 1043, a communication control unit 1050, a printer control unit 1060 that collectively controls the above units, and the like. Note that these units are accommodated at predetermined positions in a printer housing 1044.

The communication control unit 1050 controls interactive communications with a higher-level apparatus (for example, a personal computer) via a network or the like.

The photosensitive drum 1030 is a cylindrical member having a photosensitive layer at its front surface. In other words, the front surface of the photosensitive drum 1030 is a surface to be scanned. The photosensitive drum 1030 rotates in the direction as indicated by an arrow in FIG. 7.

The electrifying charger 1031, the developing roller 1032, the transfer charger 1033, the charge removing unit 1034, and the cleaning unit 1035 are arranged near the front surface of the photosensitive drum 1030 and arranged in this order along the rotating direction of the photosensitive drum 1030.

The electrifying charger 1031 uniformly charges the front surface of the photosensitive drum 1030.

The optical scanner 1010 scans the front surface of the photosensitive drum 1030 charged by the electrifying charger 1031 with a light flux modulated in accordance with image information from the higher-level apparatus and forms a latent image corresponding to the image information on the front surface of the photosensitive drum 1030. The formed latent image moves in the direction of the developing roller 1032 along with the rotation of the photosensitive drum 1030. Note that the configuration of the optical scanner 1010 is described below.

The toner cartridge 1036 stores toner, which is supplied to the developing roller 1032.

The developing roller 1032 attaches the toner supplied from the toner cartridge 1036 to the latent image formed on the front surface of the photosensitive drum 1030 to form image information. The latent image attached with the toner (hereinafter referred also to as a "toner image" for convenience sake) moves in the direction of the transfer charger 1033 along with the rotation of the photosensitive drum 1030.

The sheet feeding tray 1038 stores recording sheets 1040. The sheet feeding roller 1037 is arranged near the sheet feeding tray 1038. The sheet feeding roller 1037 picks up the recording sheets 1040 one by one from the sheet feeding tray 1038 and conveys them to the pair of resist rollers 1039. The pair of resist rollers 1039 temporarily holds the recording sheet 1040 picked up by the sheet feeding roller 1037 while feeding the recording sheet 1040 to a gap between the photosensitive drum 1030 and the transfer charger 1033 along with the rotation of the photosensitive drum 1030.

In order to electrically attract the toner on the front surface of the photosensitive drum 1030 to the recording sheet 1040, a voltage having a polarity opposite to that of the toner is applied to the transfer charger 1033. With this voltage, the toner image on the front surface of the photosensitive drum 1030 is transferred to the recording sheet 1040. The recording sheet 1040 on which the toner image has been transferred is fed to the fixing roller 1041.

The fixing roller 1041 applies heat and pressure to the recording sheet 1040 to fix the toner onto the recording sheet 1040. The recording sheet 1040 onto which the toner has been fixed is fed to the sheet catching tray 1043 by the sheet discharging roller 1042 and stacked on the sheet catching tray 1043.

The charge removing unit 1034 removes the charge on the front surface of the photosensitive drum 1030.

The cleaning unit 1035 eliminates the toner (remaining toner) remaining on the front surface of the photosensitive drum 1030. The front surface of the photosensitive drum 1030, from which the remaining toner has been eliminated, returns to the position opposing the electrifying charger 1031 again.

Next, the configuration of the optical scanner 1010 is described.

Figure 8:
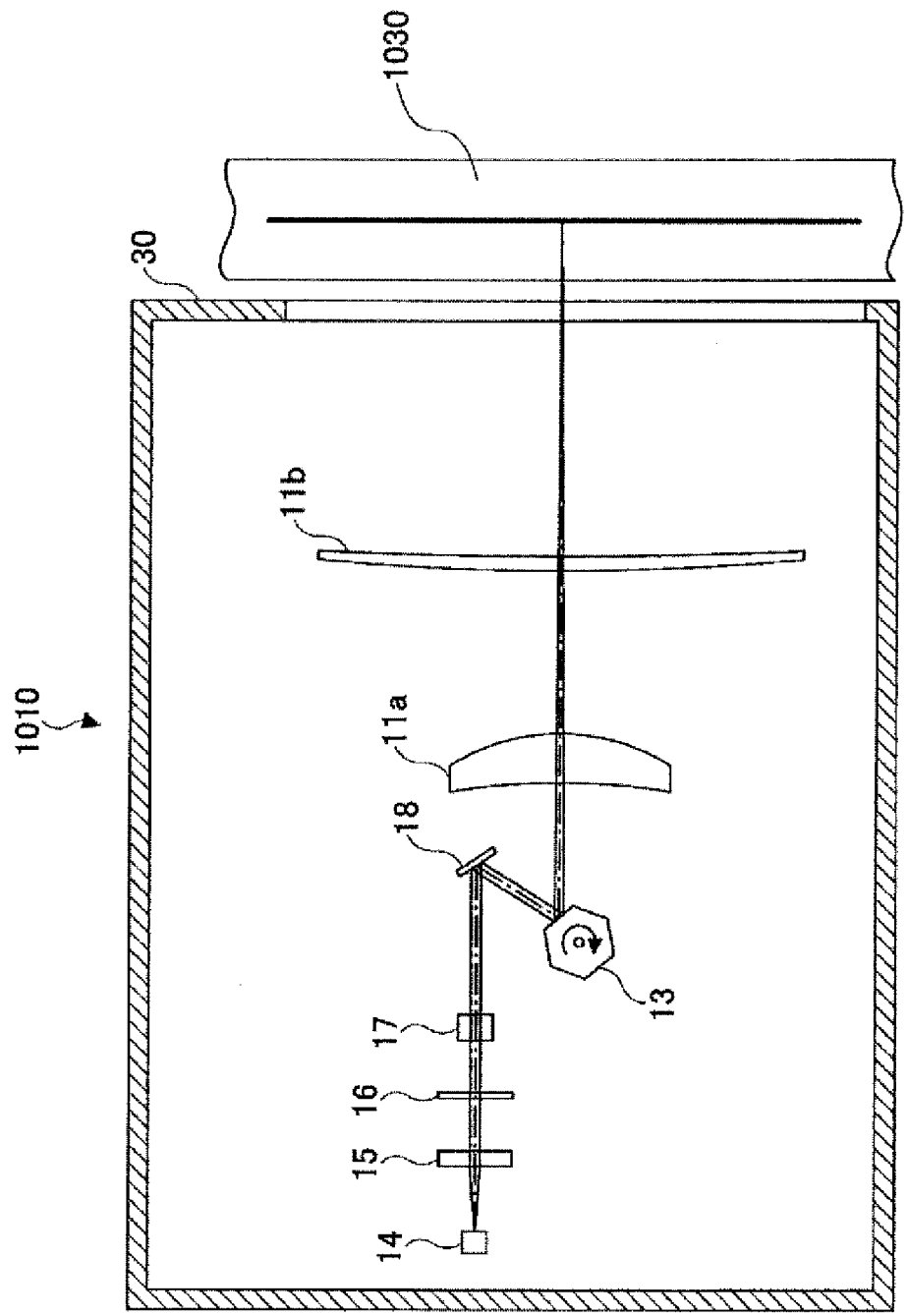
FIG. 8 is a schematic diagram showing an optical scanner shown in FIG. 7.

As shown in FIG. 8 as an example, the optical scanner 1010 has a deflector-side scanning lens 11a, an image-surface-side scanning lens 11b, a polygon mirror 13, a light source 14, a coupling lens 15, an aperture plate 16, a cylindrical lens 17, a reflecting mirror 18, a scanning control unit (not shown), and the like. These components are assembled at predetermined positions in an optical housing 30.

Note that in the following description, a direction corresponding to a main scanning direction is briefly described as a "main-scanning corresponding direction," and a direction corresponding to a sub-scanning direction is briefly described as a "sub-scanning corresponding direction" for convenience sake.

The coupling lens 15 converts light flux output from the light source 14 into substantially parallel light.

The aperture plate 16 has an aperture part, which defines the light diameter of the light flux through the coupling lens 15.

The cylindrical lens 17 forms the image of the light flux, which has passed through the aperture part of the aperture plate 16, near the deflecting and reflecting surface of the polygon mirror 13 through the reflecting mirror 18 in the sub-scanning corresponding direction.

An optical system arranged on a light path between the light source 14 and the polygon mirror 13 is called a pre-deflector optical system. In this embodiment, the pre-deflector optical system is composed of the coupling lens 15, the aperture plate 16, the cylindrical lens 17, and the reflecting mirror 18.

The polygon mirror 13 has as an example a six-surface mirror in which the radius of an inscribed circle is 18 mm, and each mirror serves as a deflecting and reflecting surface. The polygon mirror 13 deflects the light flux from the reflecting mirror 18 while rotating about a shaft parallel to the sub-scanning corresponding direction at constant speed.

The deflector-side scanning lens 11a is arranged on the light path of the light flux deflected by the polygon mirror 13.

The image-surface-side scanning lens 11b is arranged on the light path of the light flux through the deflector-side scanning lens 11a. The light flux through the image-surface-side scanning lens 11b is applied to the front surface of the photosensitive drum 1030 to form a light spot. The light spot moves in the longitudinal direction of the photosensitive drum 1030 along with the rotation of the polygon mirror 13. In other words, the light spot scans the front surface of the photosensitive drum 1030. The movement direction of the light spot at this time is the "main scanning direction." Furthermore, the rotating direction of the photosensitive drum 1030 is the "sub-scanning direction."

An optical system arranged on the light path between the polygon mirror 13 and the photosensitive drum 1030 is called a scanning optical system. In this embodiment, the scanning optical system is composed of the deflector-side scanning lens 11a and the image-surface-side scanning lens 11b. Note that at least one turning-back mirror may be arranged on at least one of the light path between the deflector-side scanning lens 11a and the image-surface-side scanning lens 11b and the light path between the image-surface-side scanning lens 11b and the photosensitive drum 1030.

Figure 9:
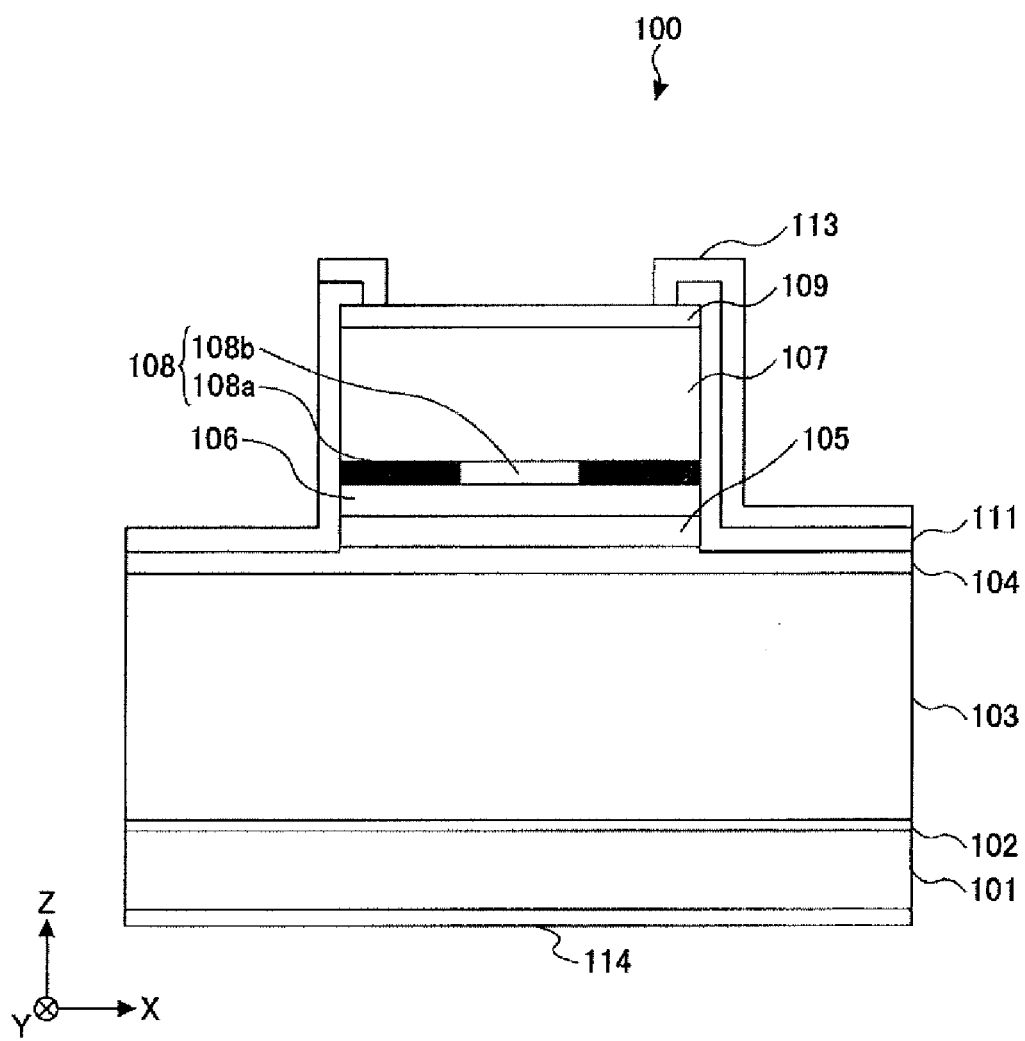
FIG. 9 is a diagram for explaining a surface-emitting laser device included in a light source shown in FIG. 8.

As shown in FIG. 9 as an example, the light source 14 has a surface-emitting laser device 100. Note that in this specification, a laser oscillating direction is defined as a Z-axis direction, and two directions orthogonal to each other inside a plane perpendicular to the Z-axis direction are defined as an X-axis direction and a Y-axis direction, respectively.

The surface-emitting laser device 100 has an oscillation wavelength of a 780 nm band, and has a substrate 101, a buffer layer 102, a lower semiconductor DBR 103, a lower spacer layer 104, an active layer 105, an upper spacer layer 106, an upper semiconductor DBR 107, a contact layer 109, and the like.

Figure 10A:
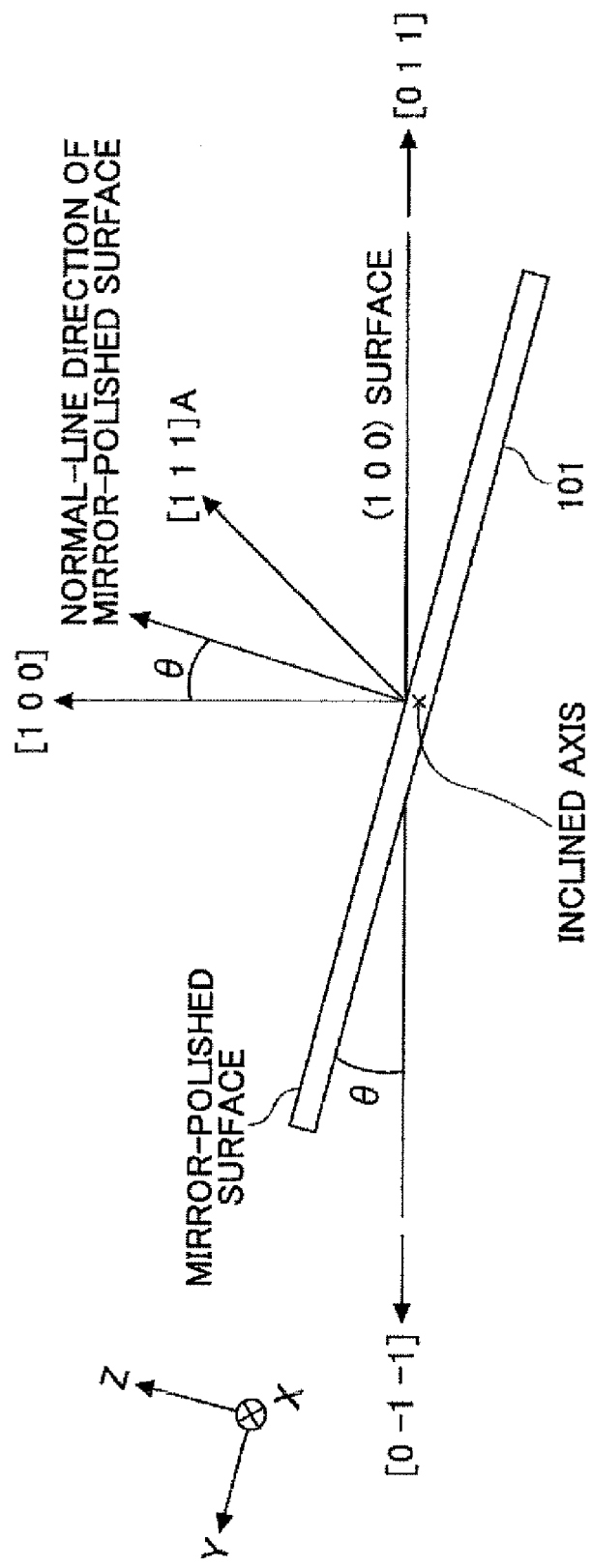
FIGS. 10A and 10B are diagrams for explaining a substrate shown in FIG. 9.
Figure 10B:
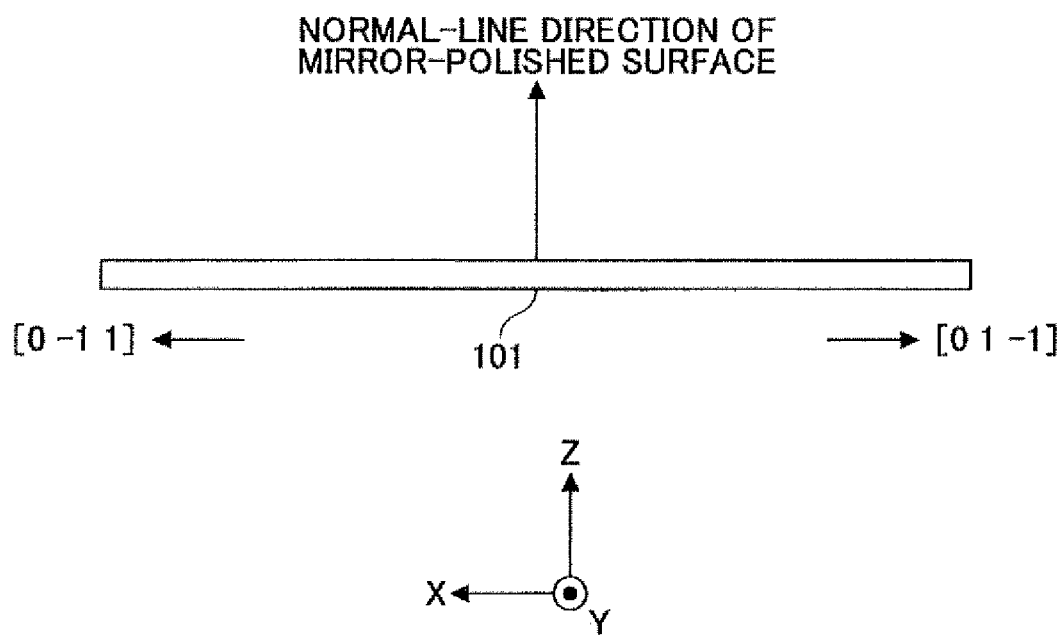

The substrate 101 has a mirror-polished surface as its front surface. As shown in FIG. 10A, the substrate 101 is an n-GaAs single-crystal substrate in which the normal-line direction of the mirror-polished surface is inclined by 15 degrees ($\theta=15$ degrees) toward a crystal orientation [1 1 1] A direction relative to a crystal orientation [1 0 0] direction. In other words, the substrate 101 is a so-called inclined substrate. Here, as shown in FIG. 10B, the normal-line direction of the mirror-polished surface is arranged such that a crystal orientation [0 1 −1] direction is defined as a negative X-direction, and a crystal orientation [0 −1 1] direction is defined as a positive X-direction.

Referring back to FIG. 9, the buffer layer 102 is laminated on the surface of the positive Z-side of the substrate 101 and made of N-GaAs.

The lower semiconductor DBR 103 is laminated on the surface of the positive Z-side of the buffer layer 102 and has 42.5 pairs of low refractive-index layers made of n-$Al_{0.93}Ga_{0.07}As$ and high refractive-index layers made of n-$Al_{0.3}Ga_{0.7}As$. In order to reduce electric resistance, a composition inclined layer having a thickness of 20 nm, in which compositions are gradually changed from one to the other, is provided between the respective refractive-index layers. Each of the refractive-index layers is set in such a manner as to have an optical thickness of $\lambda/4$ including ½ of the neighboring composition inclined layer assuming that an oscillating wavelength is $\lambda$. Note that when the optical thickness is $\lambda/4N$, the actual thickness D of the layer is expressed by $D=\lambda/4$ (where N is the refractive index of the medium of the layer).

The lower spacer layer 104 is laminated on the positive Z-side of the lower semiconductor DBR 103 and made of non-doped $Al_{0.33}Ga_{0.67}As$.

The active layer 105 is laminated on the positive Z-side of the lower spacer layer 104 and has a three quantum well structure made of GaInAsP/$Al_{0.33}Ga_{0.67}As$.

The upper spacer layer 106 is laminated on the positive Z-side of the active layer 105 and made of non-doped $Al_{0.33}Ga_{0.67}As$.

A part composed of the lower spacer layer 104, the active layer 105, and the upper spacer layer 106 is called a resonator structure and set in such a manner as to have an optical thickness of one wavelength including ½ of the neighboring composition inclined layer. Note that the active layer 105 is provided at the center of the resonator structure, which corresponds to the antinode of a stationary wave distribution in an electric field, so as to obtain a high stimulated emission probability.

The upper semiconductor DBR 107 is laminated on the positive Z-side of the upper spacer layer 106 and has 32 pairs of low refractive-index layers made of p-$Al_{0.93}Ga_{0.07}As$ and high refractive-index layers made of p-$Al_{0.33}Ga_{0.67}As$. A composition inclined layer is provided between the respective refractive-index layers. Each of the refractive-index layers is set in such a manner as to have an optical thickness of $\lambda/4$ including ½ of the neighboring composition inclined layer.

In one of the low-refractive index layers of the upper semiconductor DBR 107, a selectively oxidized layer that is made of p-$Al_{0.99}Ga_{0.01}As$ and has a thickness of 30 nm is inserted. The selectively oxidized layer is inserted in the second pair of the low-refractive index layer and the high-refractive index layer from the upper spacer layer 106.

The contact layer 109 is laminated on the positive Z-side of the upper semiconductor DBR 107 and made of p-GaAs.

In the following description, one having the plural semiconductor layers laminated on the substrate 101 as described above is called a "laminated body" for convenience sake.

FIG. 11 shows an oxidation apparatus 6000 used for manufacturing the surface-emitting laser device 100. The oxidation apparatus 6000 has a vapor supply unit 6010, a stainless-steel reaction vessel 6020, an introduction pipe 6030, an exhaust pipe 6040, a water collection vessel 6050, a temperature controller (not shown), and the like.

The vapor supply unit 6010 has a mass flow controller 6011, a vaporizing vessel 6012, a liquid mass flow controller 6013, and a water supply vessel 6014. In addition, the stainless-steel reaction vessel 6020 accommodates a tray 6021 on which an object to be oxidized is mounted, a circular-plate-like heating table 6022 that includes a ceramic heater 6024 for heating the object to be oxidized through the tray 6021, a thermocouple 6025 that measures the temperature of the object to be oxidized, and a base 6023 capable of holding and rotating the heating table 6022.

The temperature controller controls a current (voltage) to be supplied to the ceramic heater 6024 while monitoring an output signal from the thermocouple 6025, and holds the object to be oxidized at a specified temperature (holding temperature) for a specified time period (holding time).

In the vapor supply unit 6010, $N_2$ carrier gas containing vapor is generated as oxidizing atmosphere gas. The oxidizing atmosphere gas is supplied into the stainless-steel reaction vessel 6020 through the introduction pipe 6030.

The oxidizing atmosphere gas supplied into the stainless-steel reaction vessel 6020 is supplied to the periphery of the object to be oxidized. As a result, the object to be oxidized is exposed to the vapor atmosphere and oxidized. Then, the oxidizing atmosphere gas is exhausted via the exhaust pipe 6040 and the water collection vessel 6050.

Figure 12A:
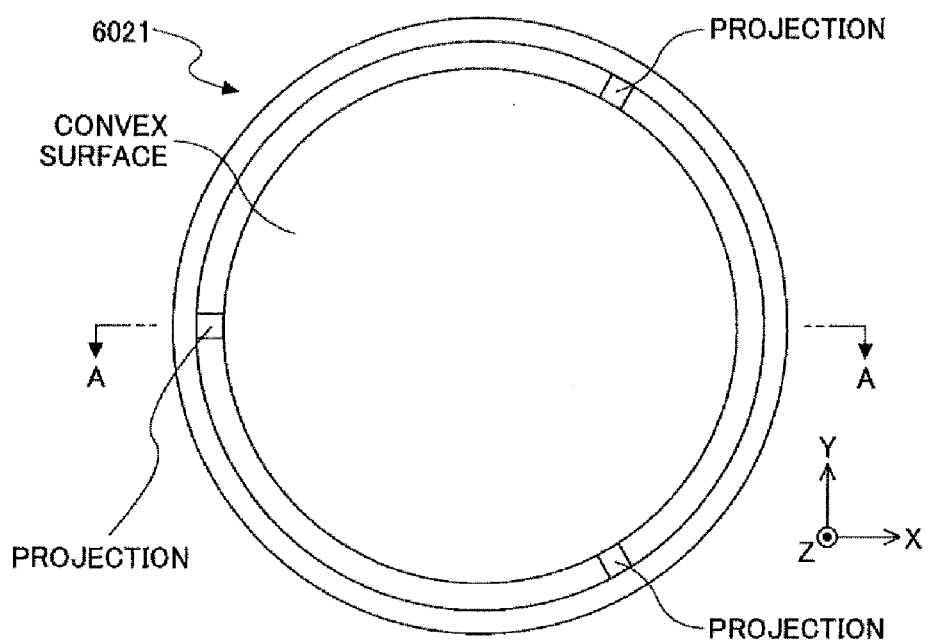
FIGS. 12A and 12B are diagrams for explaining a tray shown in FIG. 11.
Figure 12B:
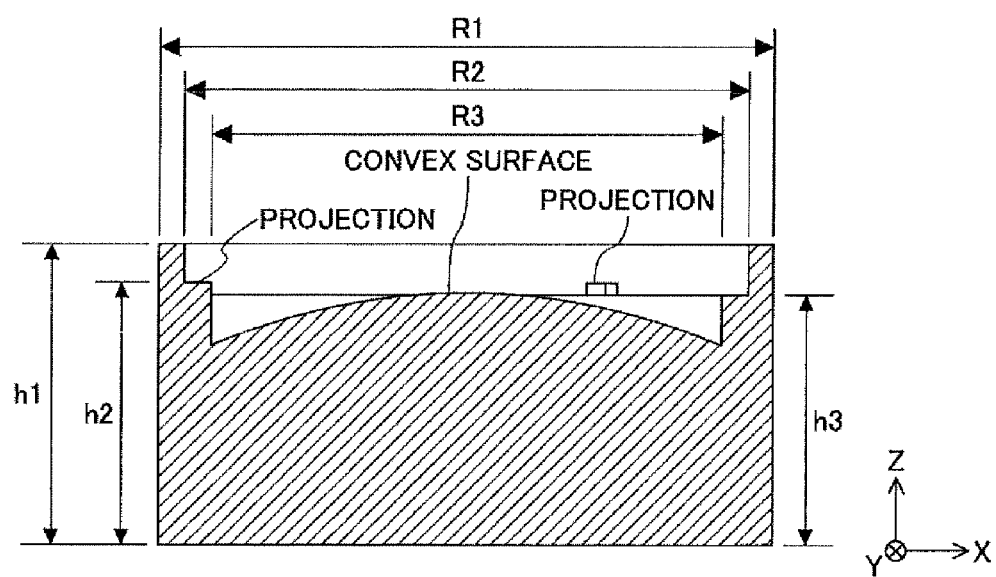

As shown in FIG. 12A and FIG. 12B which is a cross-sectional view taken along the line A-A in FIG. 12A, the rosy 6021 is a carbon member having a column-like outer shape. The surface on the positive Z-side of the tray 6021 is a spherical convex surface, and the periphery of the tray 6021 is surrounded by a wall. Here, R1 is 84.5 mm $\phi$, R2 is 77.3 mm $\phi$, R3 is 73.3 mm $\phi$, h1 is 6.2 mm, h2 is 5.5 mm, and h3 is 5.3 mm.

The convex surface of the tray 6021 is formed to follow the warpage of the object to be oxidized at the holding temperature described above.

Here, provided that the thickness of a substrate is D, the coefficient of the thermal expansion of the substrate is $\alpha_s$, the Young's modulus of the substrate is $E_s$, the Poisson's ratio of the substrate is $\nu_s$, the thickness of a thin film is d, the coefficient of thermal expansion of the thin film the Young's modulus of the thin film is $E_f$, the Poisson's ratio of the thin film is $\nu_f$, and a change in temperature is $\Delta T$, the formulae t=d/D and e=$[E_f/(1-\nu_f)]/[E_s/(1-\nu_s)]$ are established. Assuming that e·t<<1 and the warpage of the substrate is caused only by thermal stress due to a difference in the coefficient of the thermal expansion between the substrate and the thin film, the curvature $(1/R)_{DTE}$ of the substrate is expressed by the following formula (1) (see "estimation method for internal stress of thin film and occurrence factors," Applied Physics, vol. 57, pages 1856-1867, 1988).

$$(1/R)_{DTE} = 6[E_f(1-\nu_s)d/E_s(1-\nu_f)D2](\alpha_f - \alpha_s)\Delta T \qquad (1)$$

According to the embodiment of the present invention, since the oxidation temperature is set at 365° C., it is found from the formula (1) that the warped surface of the object to be oxidized is a curved surface having a curvature radius of 100 cm.

Thus, the convex surface of the tray 6021 is a curved surface having a curvature radius of 100 cm.

Figure 13:
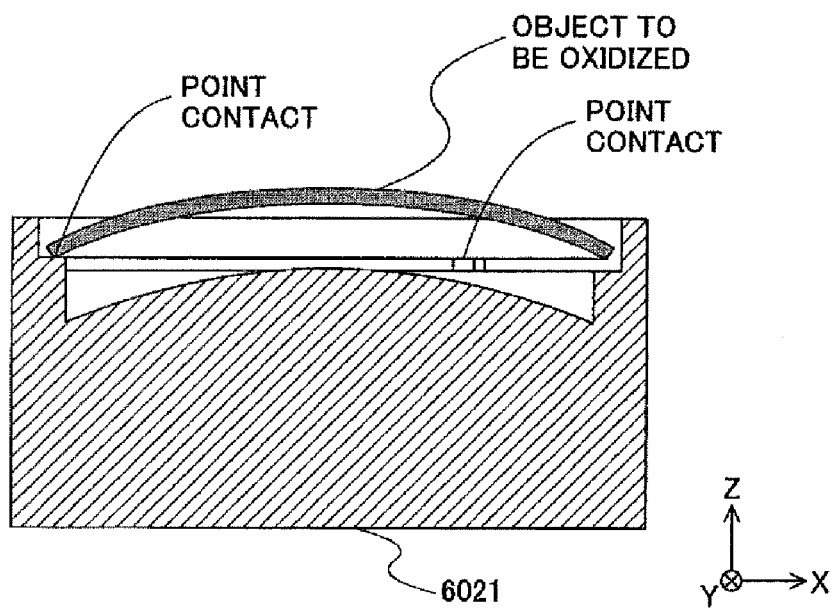
FIG. 13 is a diagram for explaining a state in which the object to be oxidized is supported by the tray.

Further, the wall at the periphery of the convex surface has a stepped structure. The stepped structure has projections at three stepped parts in such a manner as to be separated from each other by 120 degrees. As shown in FIG. 13 as an example, the object to be oxidized is supported by the projections of the stepped structure. In this case, the object to be oxidized is supported by three points at the surface on the positive Z-side of the tray 6021.

Moreover, except for the points at which the object to be oxidized is supported, an interval between the surface on the positive Z-side of the tray 6021 and the object to be oxidized is uniform from the central part of the object to be oxidized to at least a peripheral part in one direction.

Note that in FIGS. 12A, 12B, and 13, the convex surface of the tray 6021 is exaggerated in illustration for comprehension purposes. Similarly, in FIG. 13, the warpage of the object to be oxidized is exaggerated in illustration.

Next, a method for manufacturing the surface-emitting laser device 100 is described.

(1) The laminated body is formed by crystal growth using a metal organic chemical vapor deposition method (MOCVD method) or a molecular beam epitaxial growing method (MBE method).

Here, trimethyl aluminum (TMA), trimethyl gallium (TMG), and trimethyl indium (TMI) are used as group III materials, and phosphine ($PH_3$) and arsin ($AsH_3$) are used as group V materials. Further, carbon tetrabromide ($CBr_4$) and dimethyl zinc (DMZn) are used as p-type dopant materials, and hydrogen selenide ($H_2Se$) is used as an n-type dopant material.

(2) On the front surface of the laminated body, square-like resist patterns having a side of 25 µm are formed so as to obtain desired mesas.

(3) Through the resist patterns as a photomask, quadrangular-column-like mesas are formed by an ICP dry etching method. Here, etching is performed down to the lower spacer layer 104.

(4) The photomask is removed.

Figure 14:
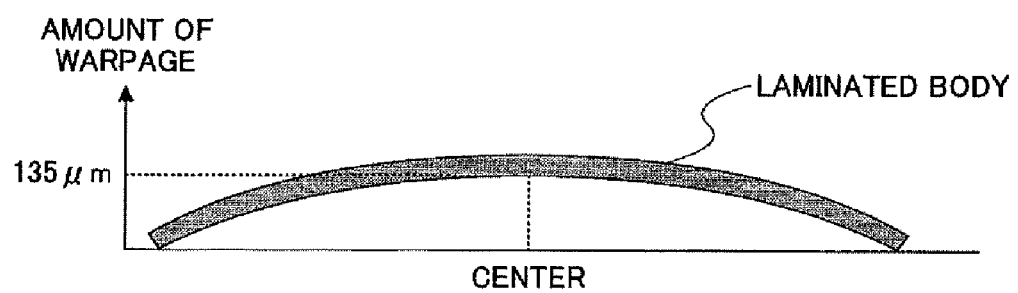
FIG. 14 is a diagram for explaining the warpage of a laminated body.

Here, the warpage of the laminated body was measured by a three-dimensional measurement machine. As shown in FIG. 14 as an example, the central part of the laminated body bulged relative to the periphery of the laminated body and was formed into a convex shape. The amount of warpage of the laminated body from the central part to one direction was 135 µm.

(5) The laminated body on which the mesas have been formed is set in the oxidation apparatus 6000 as the object to be oxidized, and subjected to oxidation processing. Here, Al (aluminum) of the selective oxidized layer 108 is selectively oxidized from the peripheral parts of the mesas. Then, non-oxidized regions 108b surrounded by Al-oxidized layer 108a are caused to remain at the centers of the mesas. Thus, the oxidized confinement structures are manufactured, which allow the driving current of the light-emitting parts to be supplied only at the centers of the mesas. The non-oxidized regions 108b are the current passing regions (current injection regions).

Here, the oxidation processing by the oxidation apparatus 6000 is specifically described.

(5-1) The laminated body in which the mesas have been formed is mounted on the tray 6021. The laminated body is supported by the three points of the tray 6021.

(5-2) The tray 6021 is mounted on the heating table 6022 together with the laminated body.

(5-3) The oxidizing atmosphere gas made of a predetermined amount of vapor and $N_2$ carrier gas is introduced into the stainless-steel reaction vessel by the vapor supply unit.

(5-4) The holding temperature of the temperature controller is set at 365° C., and the tray 6021 is heated by the ceramic heater 6024. Then, the tray 6021 is heated to 365° C. at a constant temperature rising rate.

(5-5) When a specified time period (holding time) elapses after the temperature of the tray 6021 has reached the holding temperature, the heating of the tray 6021 is stopped and the temperature of the tray 6021 is rapidly reduced. Note that the processing here is automatically performed using the temperature controller.

(5-6) The laminated body is taken out from the stainless-steel reaction vessel. Thus, the oxidization processing of the laminated body is completed.

Figure 15:
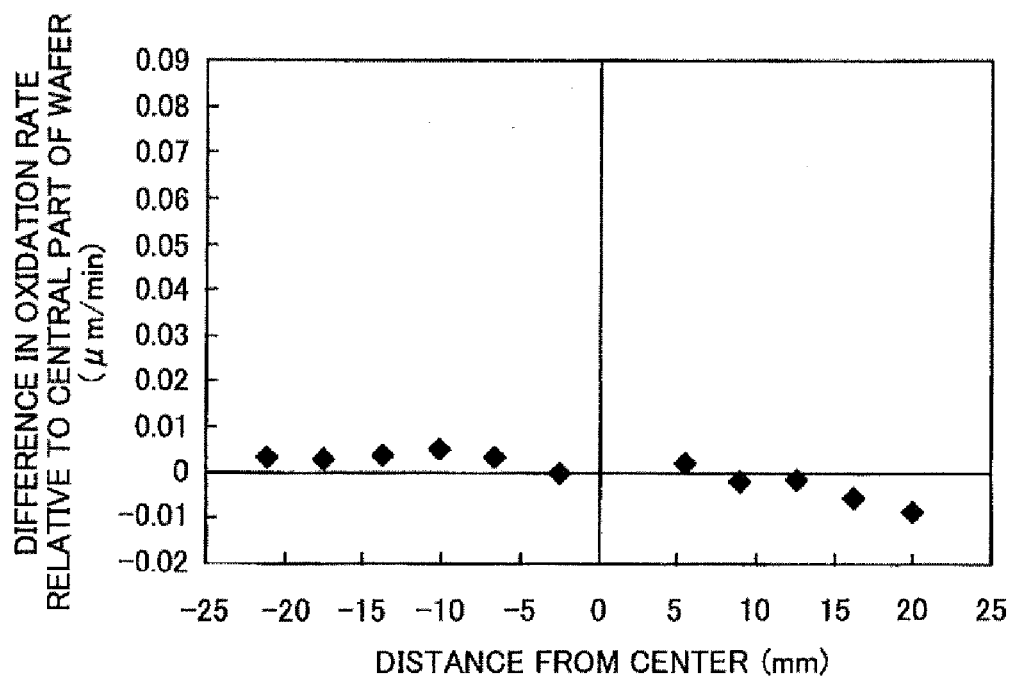
FIG. 15 is a graph for explaining variations in the oxidation rate inside the plane of the laminated body.

When the oxidized confinement structure of each mesa oxidized in the above manner was observed by an IR microscope, it was found that a difference in oxidation rate relative to the mesa at the central part of the laminated body fell within 0.015 μm/min in the X-axis direction (see FIG. 12A) as shown in FIG. 15.

Figure 16:
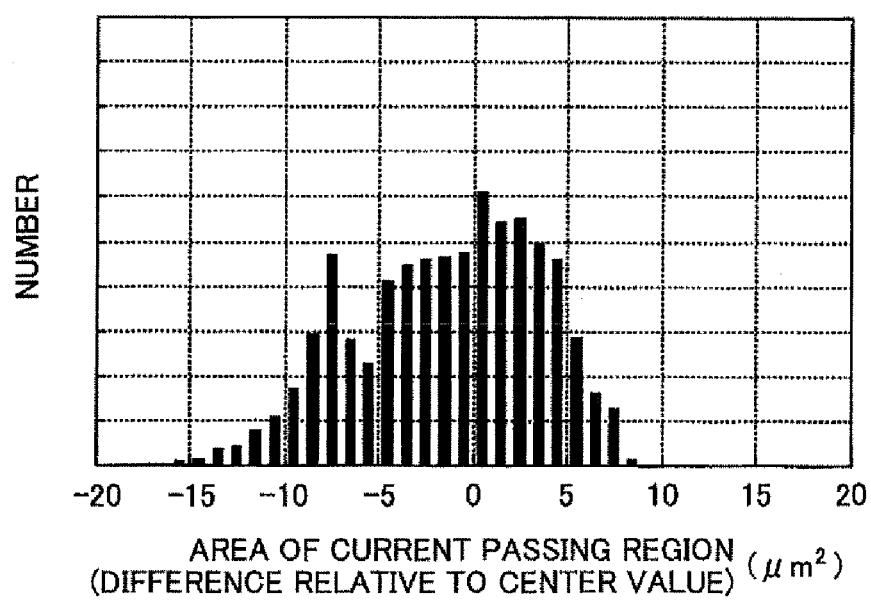
FIG. 16 is a graph for explaining variations in the area of the current passing region inside the plane of the laminated body.

In addition, as shown in FIG. 16, variations in the area of the current passing region of each mesa were reduced, which in turn improved a manufacturing yield.

(6) A protection layer 111 made of SiN, SiON, or $SiO_2$ is formed on the oxidized laminated body to which the oxidation processing has been applied by a vapor phase chemical deposition method (CVD method).

(7) The windows of p-side electrode contacts are opened at the upper parts of the mesas. Here, after a mask using a photoresist is applied to the mesas, opening parts at the upper parts of the mesas are exposed to remove the photoresist. Then, the protection layer 111 is etched by BHF. As a result, opening are formed at the upper parts of the mesas.

(8) At regions serving as light emitting parts on the upper parts of the mesas, square-like resist patterns having a side of 10 μm are formed, and a p-side electrode material is deposited. A multilayer film made of Cr/AuZn/Au or one made of Ti/Pt/Au is used as the p-side electrode material.

(9) The electrode material of the light emitting parts is lifted off to form p-side electrodes 113.

(10) After the rear side of the substrate 101 is polished by a predetermined thickness (for example, about 100 μm), an n-side electrode 114 is formed. Here, the n-side electrode 114 is a multi-layer film made of AuGe/Ni/Au.

(11) Ohmic conduction between the p-side electrodes 113 and the n-side electrode 114 is obtained by annealing. Thus, the mesas are converted into the light-emitting parts.

(12) Each chip is cut out.

Further, two other similar laminated bodies were manufactured, and the oxidation processing was performed using the oxidation apparatus 6000 in the same manner described above. As a result, it was found that variations in oxidation rate between the three laminated bodies were extremely reduced to ±0.005 μm/min.

Figure 17A:
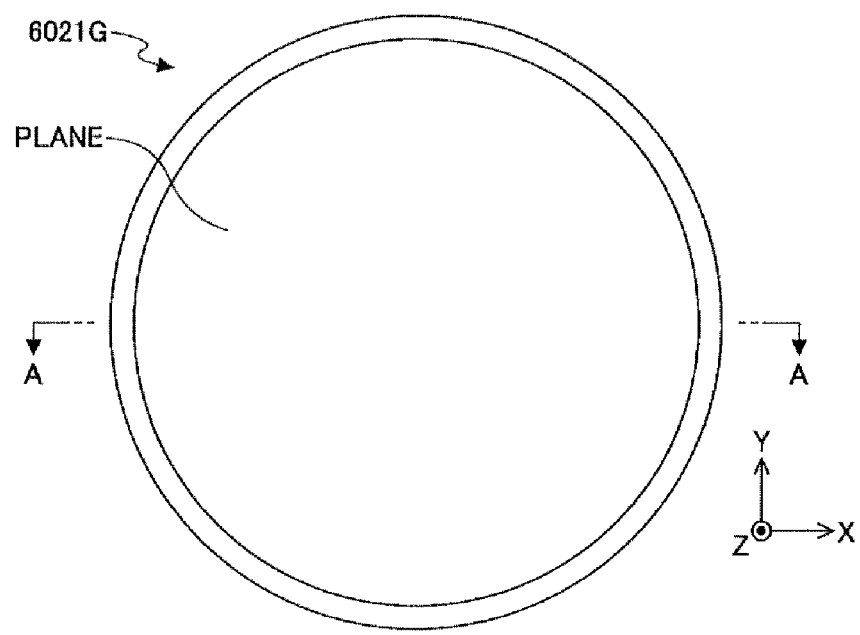
FIGS. 17A and 17B are diagrams for explaining a comparative example of the tray.
Figure 17B:
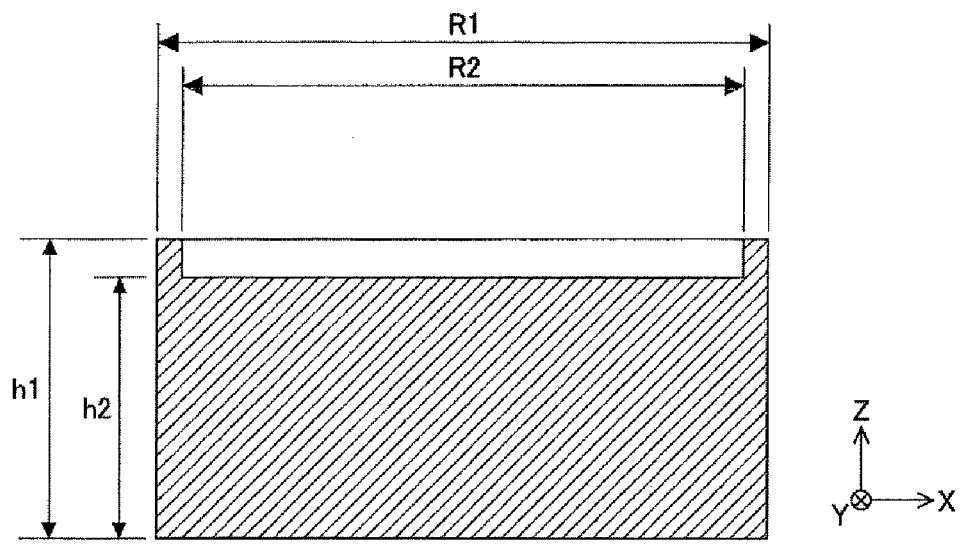
Figure 18:
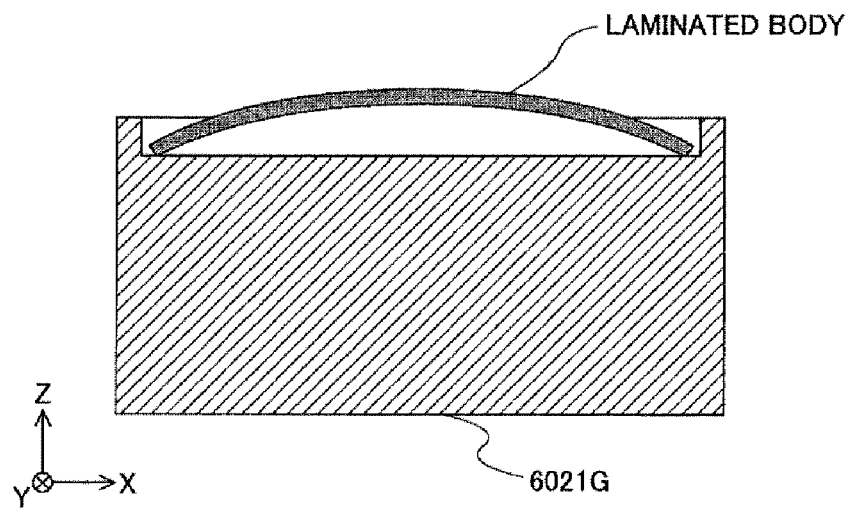
FIG. 18 is a diagram for explaining a state in which the laminated body is supported by the tray according to the comparative example.
Figure 19:
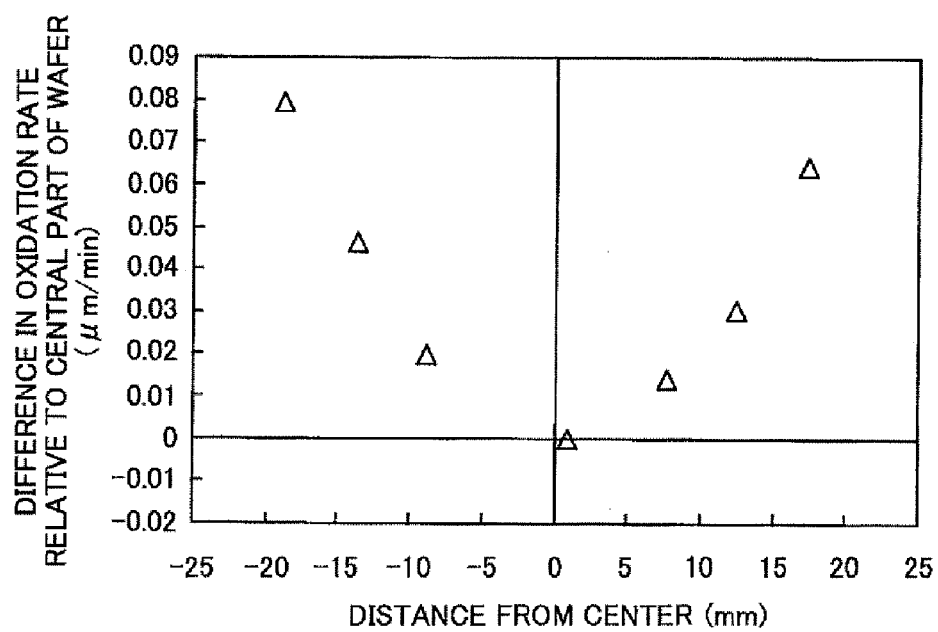
FIG. 19 is a graph for explaining variations in the oxidation rate inside the plane of the laminated body when the tray according to the comparative example is used.
Figure 20:
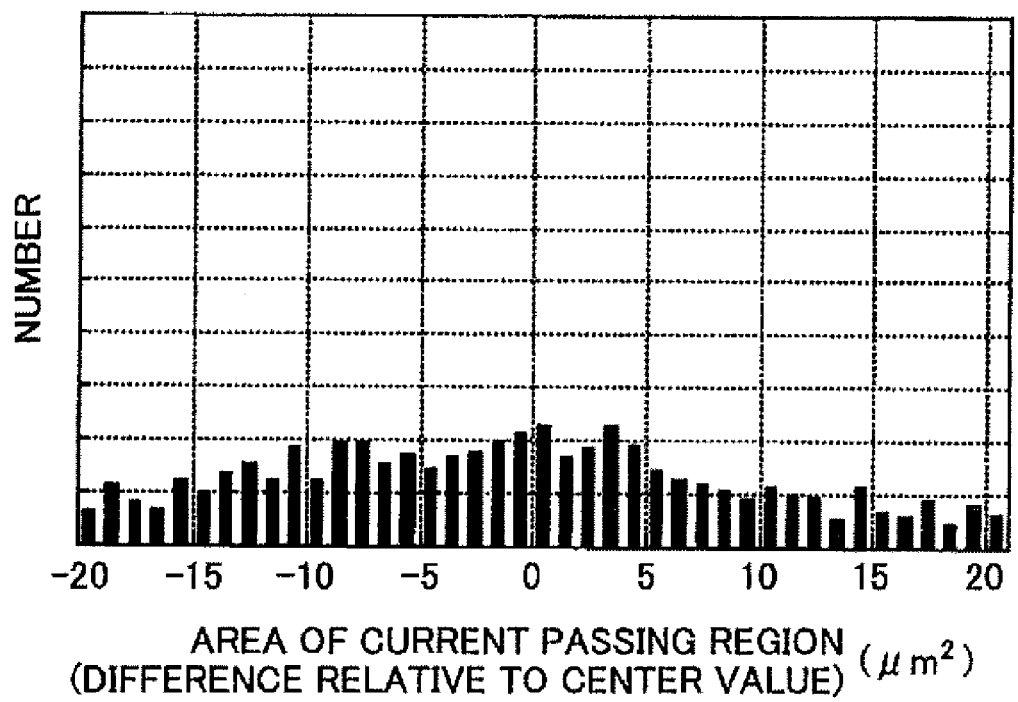
FIG. 20 is a graph for explaining variations in the area of the current passing region inside the plane of the laminated body when the tray according to the comparative example is used.

Meanwhile, for comparison purposes, a conventional tray 6021 having a flat surface on its positive Z-side as shown in FIG. 17A and FIG. 17B which is a cross-sectional view taken along the line A-A in FIG. 17A was used instead of the tray 6021 so as to perform the oxidation processing on the laminated body in which the mesas have been formed. In this case, the laminated body was supported in such a manner as to be in line-contact with the bottom surface of the tray 6021G (see FIG. 18). When the oxidized confinement structure of each mesa was observed by an IR microscope, it was found that a difference in oxidation rate relative to the mesa at the central part of the laminated body reached 0.080 μm/min as shown in FIG. 19. This difference is as five or more times as large as that according to the embodiment of the present invention. Further, as shown in FIG. 20, variations in the area of the current passing region of each mesa were large, and manufacturing yield was lower than that according to the embodiment of the present invention.

Moreover, the susceptor for a vapor-phase growth apparatus disclosed in Patent Documents 4 and 5 caused large variations due to the shape of its bottom surface, and thus its manufacturing yield was lower than that according to the embodiment of the present invention.

As is clear from the above description, the oxidation apparatus according to the embodiment of the present invention is used in the method for manufacturing the surface-emitting laser device 100. Thus, the method for manufacturing the surface-emitting laser device according to the embodiment of the present invention is performed.

As described above, in the method for manufacturing the surface-emitting laser device 100 according to the embodiment of the present invention, the laminated body is manufactured in which the lower semiconductor DBR 103, the resonator structure including the active layer 105, and the upper semiconductor DBR 107 having the selectively oxidized layer 108, and the like are laminated on the substrate 101. Then, the laminated body is etched from its upper surface to form the mesas having at least the selectively oxidized layer 108 exposed at its side surfaces. After that, the selectively oxidized layer 108 is selectively oxidized from the side surfaces of the mesas by the oxidation apparatus 6000. As a result, the confinement structure is formed in which the current passing region is surrounded by the oxide.

The oxidation apparatus 6000 has the stainless-steel reaction vessel 6020. In the stainless-steel reaction vessel 6020, the tray 6021 on which the laminated body is mounted, the circular-like heating table 6022 that includes the ceramic heater 6024 for heating the laminated body through the tray 6021, and the like are accommodated.

The surface on the positive Z-side of the tray 6021 is shaped to follow the warpage of the laminated body at the oxidation temperature, and the periphery of the tray 6021 is surrounded by the wall. Further, the projections are provided at the three parts of the wall so as to separate them from each other by 120 degrees. The laminated body is supported by the projections. Moreover, except for the points at which the laminated body is supported, the interval between the surface on the positive Z-side of the tray 6021 and the laminated body is uniform.

In this case, variations in the oxidation degree of the selectively oxidized layers of the plural mesas formed in the laminated body can be reduced.

Accordingly, it is possible to improve the manufacturing yield of the surface-emitting laser device 100.

Further, in the optical scanner 1010 according to the embodiment of the present invention, the light source 14 has the surface-emitting laser device 100. Therefore, it is possible to perform high-precision optical scanning without incurring high cost.

Further, the laser printer 1000 according to the embodiment of the present invention has the optical scanner 1010. Therefore, it is possible to form a high-quality image without incurring high cost.

Figure 21A:
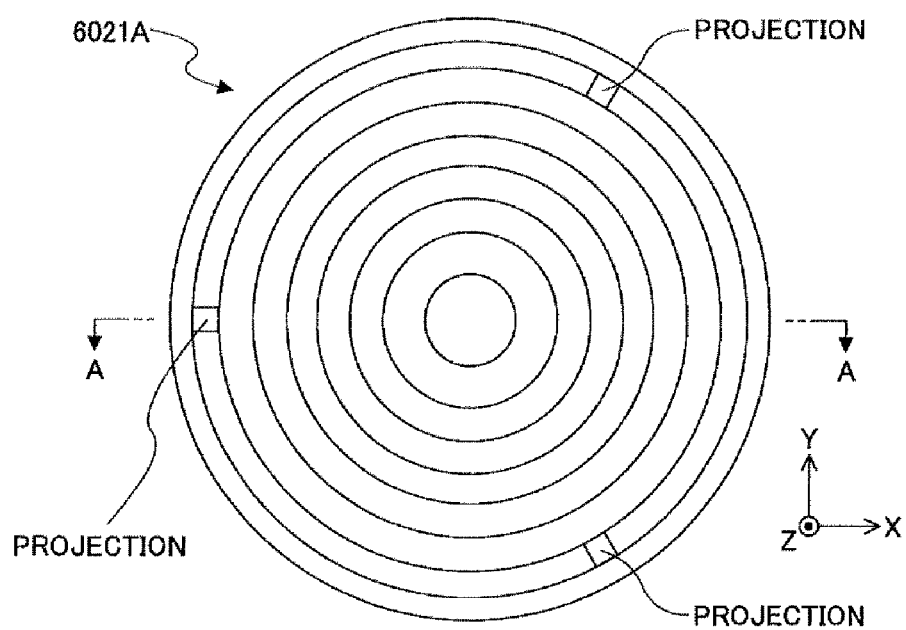
FIGS. 21A and 21B are diagrams for explaining a first modification of the tray.
Figure 21B:
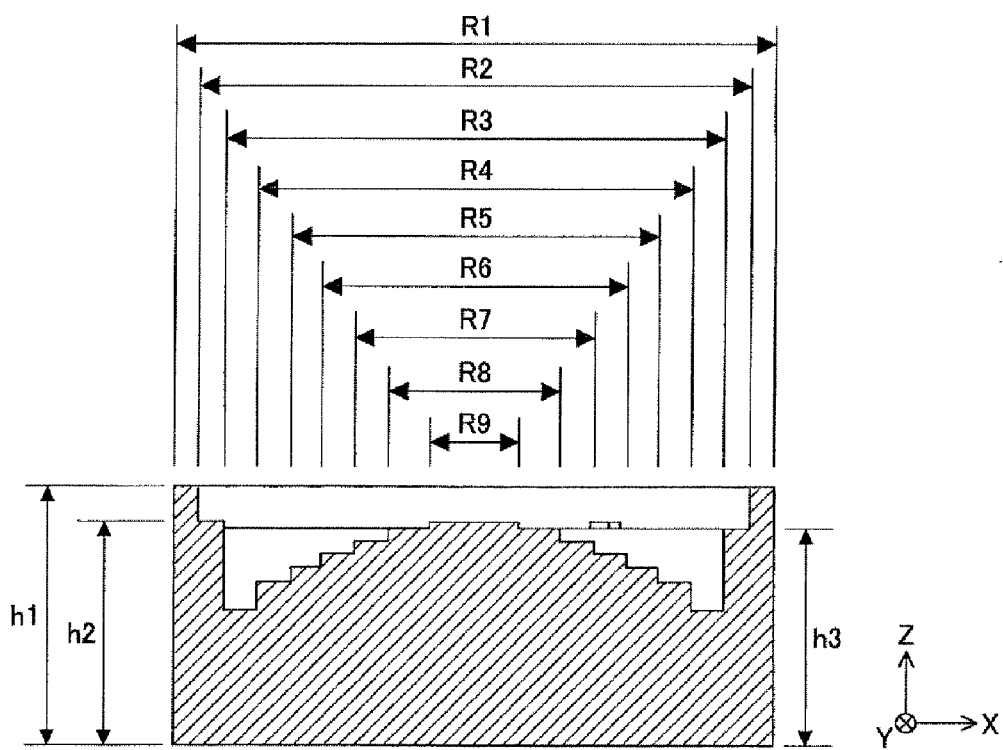

Note that in the embodiment described above, a multiple-stage tray 6021A with its surface on the positive 2-side elevated in a stepwise manner from a peripheral part to a central part as shown in FIG. 21A and FIG. 21B, which is a cross-sectional view taken along the line A-A in FIG. 21A, may be used instead of the tray 6021 so as to perform the oxidation processing on the laminated body in which the mesas have been formed. The multiple-stage shape of the tray 6021A approximates the shape that follows the warpage of the object to be oxidized at the holding temperature described above.

The surface on the positive Z-side of the tray 6021A has a seven-stage structure as an example. Assuming that the lowest position is the first stage and the highest position is the seventh stage, the seven stepped parts of the tray 6021A are concentrically arranged as seen from the Z-axis direction. The diameter R9 of the seventh stage is 20 mm, the diameter R8 of the sixth stage is 28 mm, the diameter R7 of the fifth stage is 34 mm, the diameter R6 of the fourth stage is 40 mm, the diameter R5 of the third stage is 46 mm, and the diameter R4 of the second stage is 50 mm.

Figure 22:
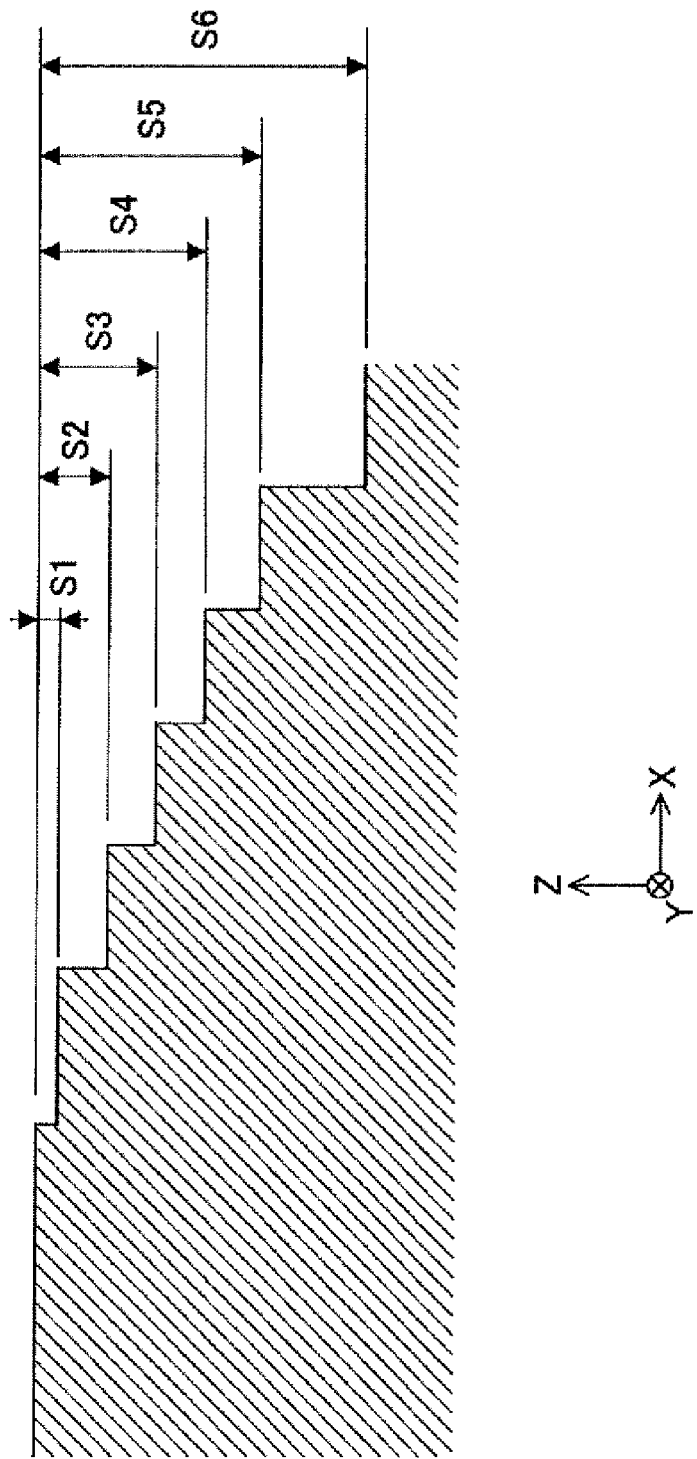
FIG. 22 is a diagram for explaining the multiple-stage structure of the tray according to the first modification.

Further, as shown in FIG. 22 as an example, the height difference S6 between the first and the seventh stages is 0.06 mm, the height difference S5 between the second and seventh stages is 0.025 mm, the height difference S4 between the third and seventh stages is 0.02 mm, the height difference S3 between the fourth and seventh stages is 0.015 mm, the height difference S2 between the fifth and seventh stages is 0.01 mm, and the height difference S1 between the sixth and seventh stages is 0.005 mm.

Figure 23:
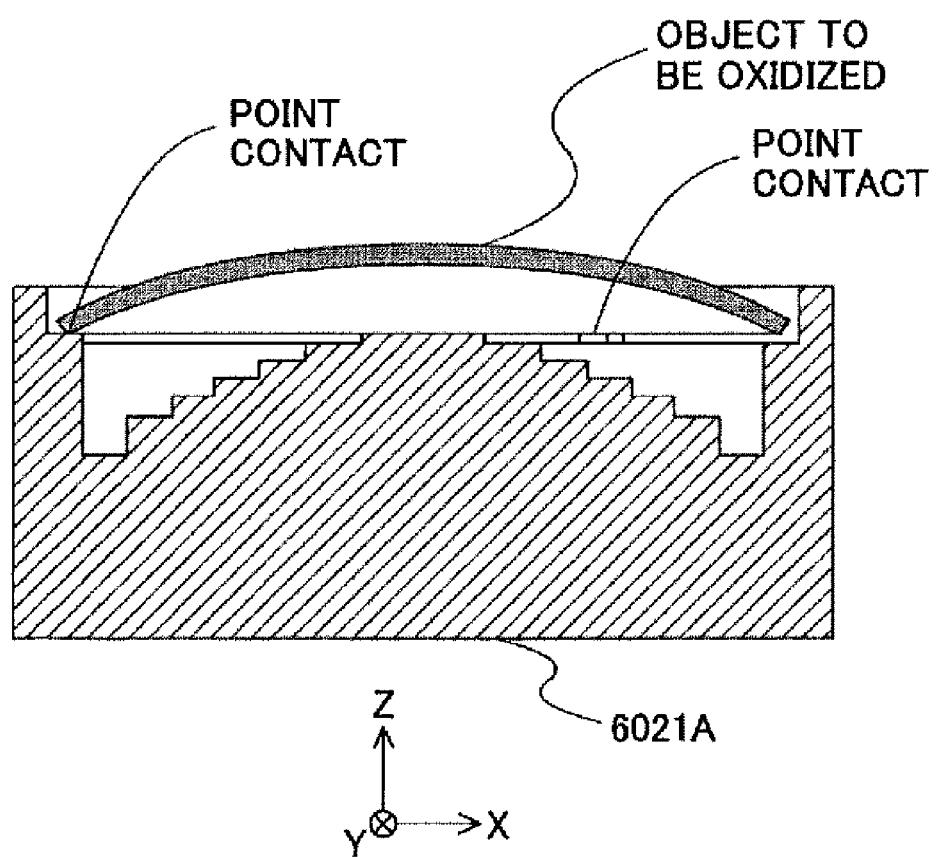
FIG. 23 is a diagram for explaining a state in which the laminated body is supported by the tray according to the first modification.

In this case as well, the laminated body is supported by the three points at the surface on the positive Z-side of the tray 6021A. Moreover, except for the points at which the laminated body is supported, the interval between the surface on the positive Z-side of the tray 6021A and the laminated body is almost uniform (see FIG. 23).

Figure 24:
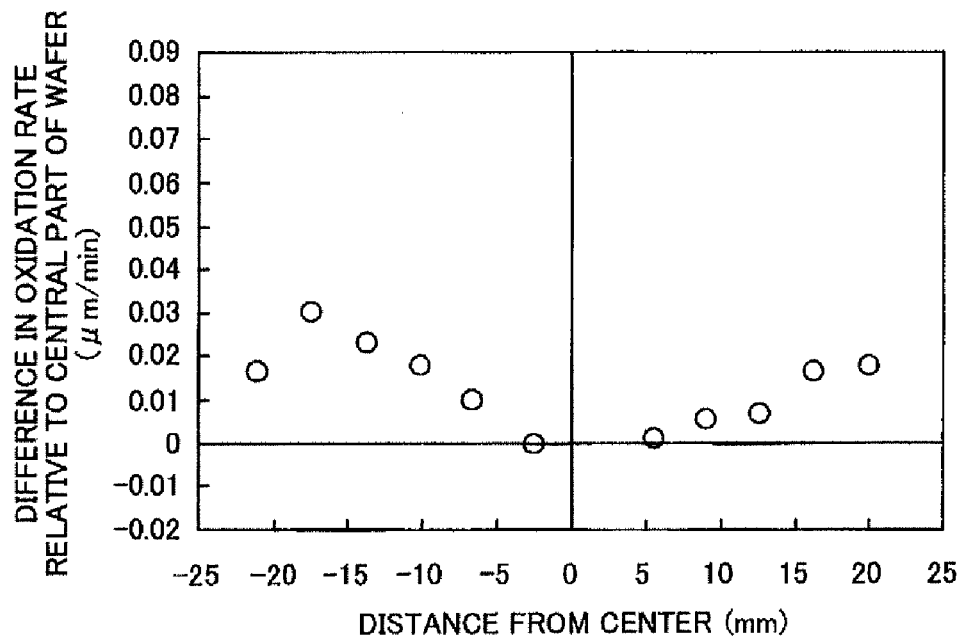
FIG. 24 is a graph for explaining variations in the oxidation rate inside the plane of the laminated body when the tray according to the first modification is used.

When the oxidized confinement structure of each mesa oxidized using the tray 6021A was observed by an IR microscope, it was found that a difference in oxidation rate relative to the mesa at the central part of the laminated body fell within 0.030 μm/min in the X-axis direction (see FIG. 21A) as shown in FIG. 24.

Figure 25:
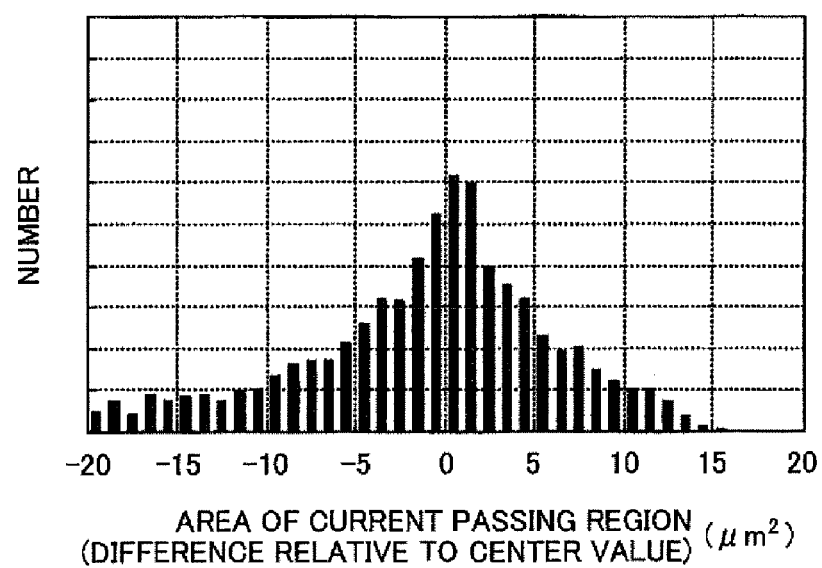
FIG. 25 is a graph for explaining variations in the area of the current passing region inside the plane of the laminated body when the tray according to the first modification is used.

In addition, as shown in FIG. 25, variations in the area of the current passing region of each mesa were reduced, which in turn improved the manufacturing yield of the surface-emitting laser device 100.

Figures 26, 27:
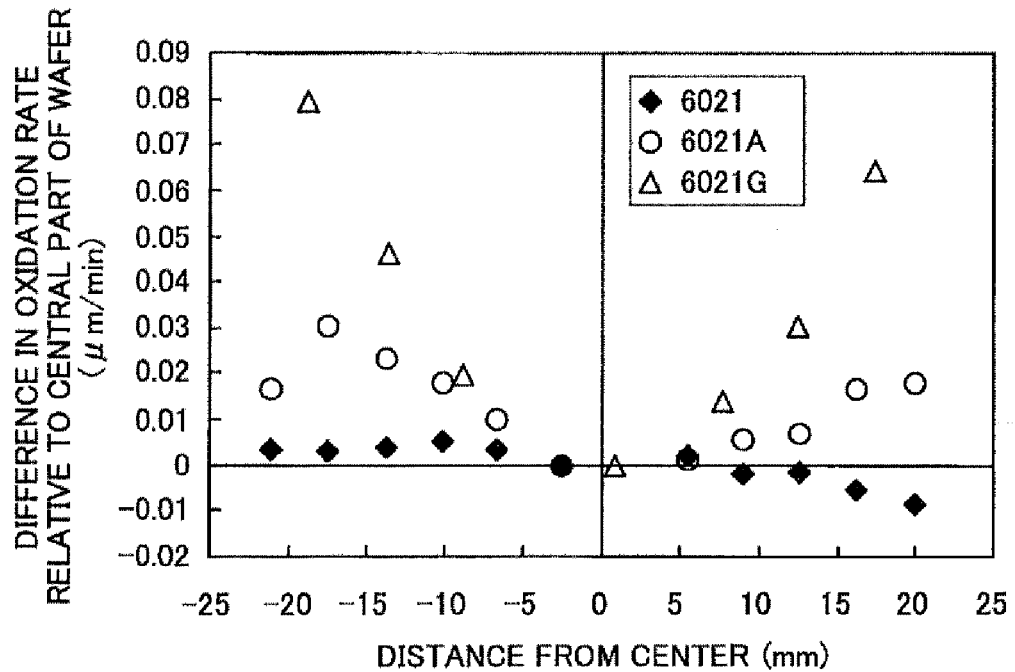
FIG. 26 is a graph (I) for explaining a relationship between the used tray and the variations in the oxidation rate inside the plane of the laminated body.
FIG. 27 is a table (II) for explaining a relationship between the used tray and the variations in the oxidation rate inside the plane of the laminated body.

Note that FIGS. 26 and 27 show differences in the oxidation rate when the trays 6021, 6021A, and 6021G are used. It is clear from FIGS. 26 and 27 that the variations in the oxidation rate when the trays 6021 and 6021A are used are remarkably reduced compared to the variations in the oxidation rate when the tray 6021G is used.

Figure 28A:
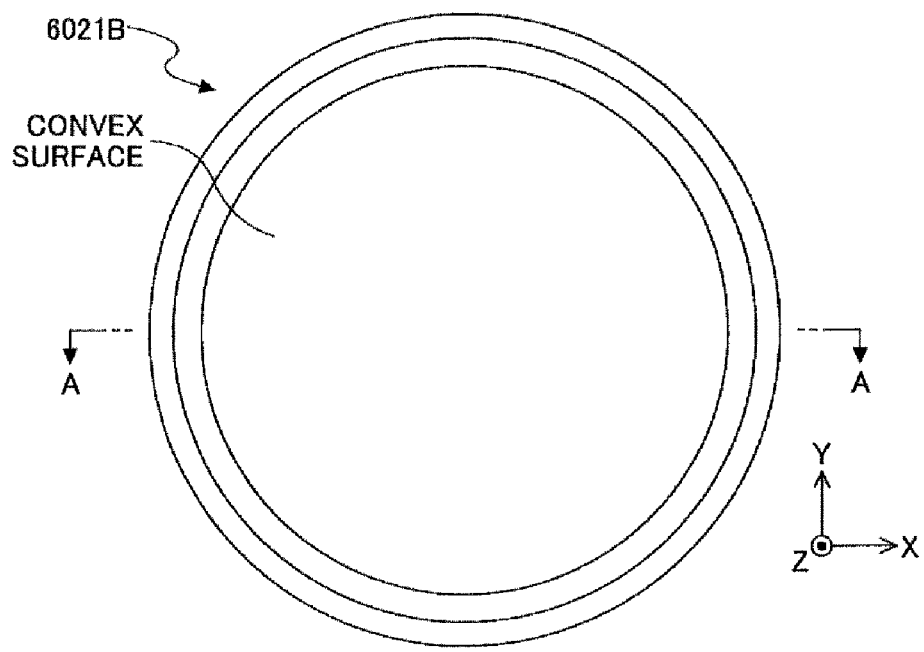
FIGS. 28A and 28B are diagrams for explaining a second modification of the tray.
Figure 28B:
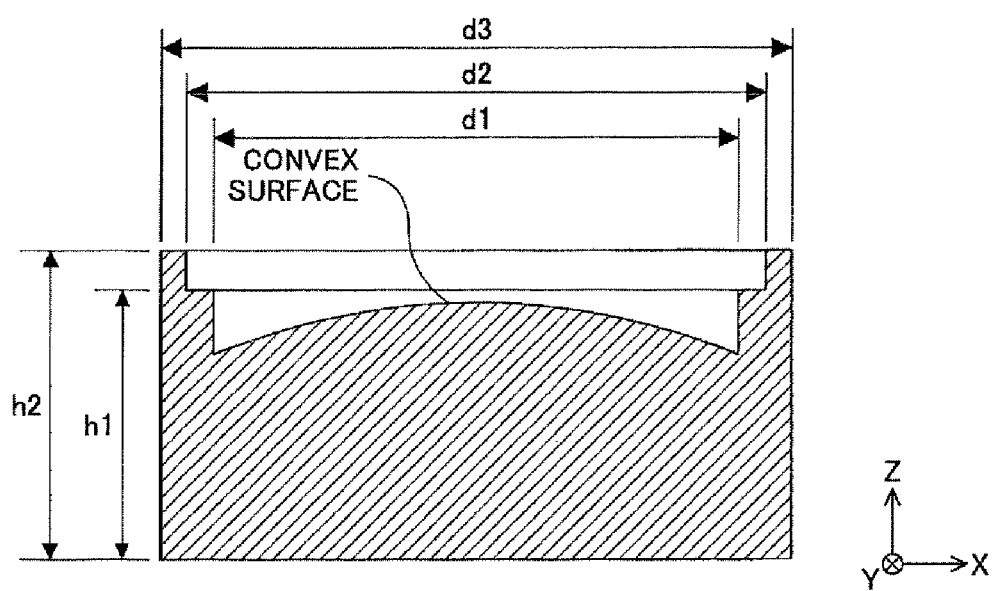
Figure 29:
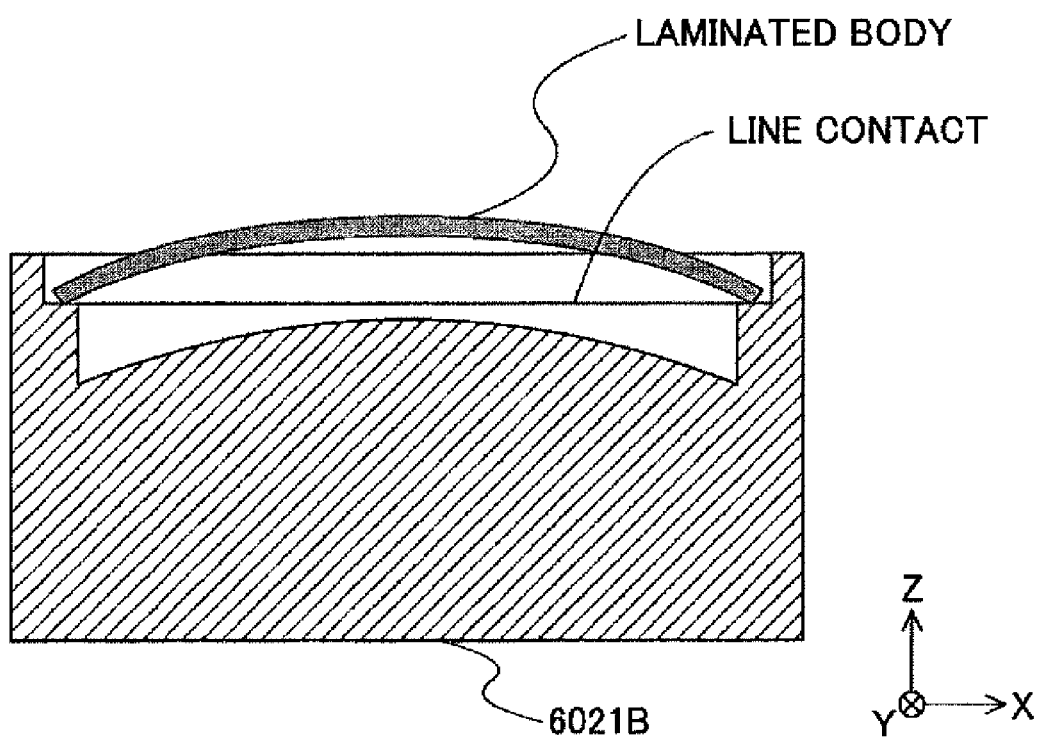
FIG. 29 is a diagram for explaining a state in which the laminated body is supported by the tray according to the second modification.

Further, in the embodiment described above, a tray 6021B as shown in FIG. 28A and FIG. 28B, which is a cross-sectional view taken along the line A-A in FIG. 28A, may be used instead of the tray 6021 so as to perform the oxidation processing on the laminated body in which the mesas have been formed. The surface on the positive Z-side of the tray 6021B is a spherical convex surface, and the periphery of the surface is surrounded by a wall. Further, the wall has a stepped structure over the whole circumference of the tray 6021B. As shown in FIG. 29 as an example, the laminated body is supported by a stepped part. In other words, the laminated body is in line-contact with the surface on the positive Z-side of the tray 6021B.

When the oxidized confinement structure of each mesa oxidized using the tray 6021B was observed by an IR microscope, it was found that a difference in oxidation rate relative to the mesa at the central part of the laminated body fell within 0.015 μm/min. This value is the same as that obtained when the tray 6021 is used. In addition, variations in the area of the current passing region of each mesa were reduced more than before, which in turn improved the manufacturing yield of the surface-emitting laser device 100.

Further, two other similar laminated bodies were manufactured, and the oxidation processing was performed using the tray 6021B in the same manner described above. As a result, it was found that variations in oxidation rate between the three laminated bodies were ±0.015 μm/min. This value is three times as large as that obtained when the oxidation processing is performed using the tray 6021 but is smaller than a conventional value.

Further, the amount of warpage of the laminated body was measured specifically. As a result, it was found that the laminated body was not formed into a sphere symmetrically uniformly warped from its central part to all directions. That is, as shown in FIG. 5, the amount of warpage of the laminated body was different; it was about 135 μm from the central part to the direction of 0° and was about 125 μm from the central part to the direction of 90°.

Accordingly, the oxidation processing was performed using a tray shaped to have a curvature radius of 100 cm in the X-axis direction and that of 110 cm in the Y-axis direction and to uniformly correct an inclination in directions between the X-axis and Y-axis directions. Note that except for the points at which the laminated body is supported, the interval between the tray and the laminated body is uniform. When the oxidized confinement structures of the plural oxidized mesas were observed by an IR microscope, it was found that a difference in oxidation rates relative to the mesa at the central part of the laminated body fell within 0.015 μm/min over the entire surface of the laminated body. Further, two other similar laminated bodies were manufactured, and the oxidation processing was performed using the oxidation apparatus 6000 in the same manner described above. As a result, it was found that variations in the oxidation rate were almost the same as those obtained when the oxidation processing was performed using the tray 6021 and were extremely reduced than before, which in turn improved the manufacturing yield of the surface-emitting laser device.

Further, the oxidation processing was performed using a tray shaped to be different from tray 6021A in that it has the height difference S6 of 0.06 mm between the first and seventh stages in the X-axis direction (see FIG. 22) and the height difference S6 of 0.055 mm between the first and the seventh stages in the Y-axis direction and uniformly corrects the height differences between the X-axis and Y-axis directions. Note that except for the points at which the laminated body is supported, the interval between the tray and the laminated body is uniform. When the oxidized confinement structures of the plural oxidized mesas were observed by an IR microscope, it was found that a difference in oxidation rates relative to the mesa at the central part of the laminated body fell within 0.030 µm/min over the entire surface of the laminated body, which in turn improved the manufacturing yield of the surface-emitting laser device.

Further, in the embodiment described above, nitrogen (N₂) gas serving as carrier gas is supplied from the vapor supply unit 6010. However, the carrier gas is not limited to nitrogen gas. Instead, argon (Ar) gas, for example, may be used.

Further, in the embodiment described above, the normal-line direction of the principle surface of the substrate 101 is inclined by 15 degrees toward the crystal orientation [1 1 1] A direction relative to the crystal orientation [1 0 0] direction, but the inclination of the normal-line direction is not limited to 15 degrees. When the inclined substrate is used, the normal-line direction of the principle surface of the substrate 101 is only required to be inclined toward one crystal orientation [1 1 1] direction relative to another crystal orientation [1 0 0] direction.

Further, in the embodiment described above, the substrate 101 is an inclined substrate. However, the substrate 101 is not limited to the inclined substrate.

Further, in the embodiment described above, the light-emitting parts have an oscillation wavelength of a 780 nm band. However, the oscillation wavelength of the light-emitting parts is not limited to the 780 nm band. The oscillation wavelength may be changed in accordance with the characteristics of the photosensitive body.

Further, the surface-emitting laser device 100 can be applied not only to the image forming apparatus but also to other purposes. In this case, the light-emitting parts may have an oscillation wavelength of a 650 nm band, a 850 nm band, a 980 nm band, a 1.3 µm band, a 1.5 µm band, or the like in accordance with intended purposes.

Figure 30:
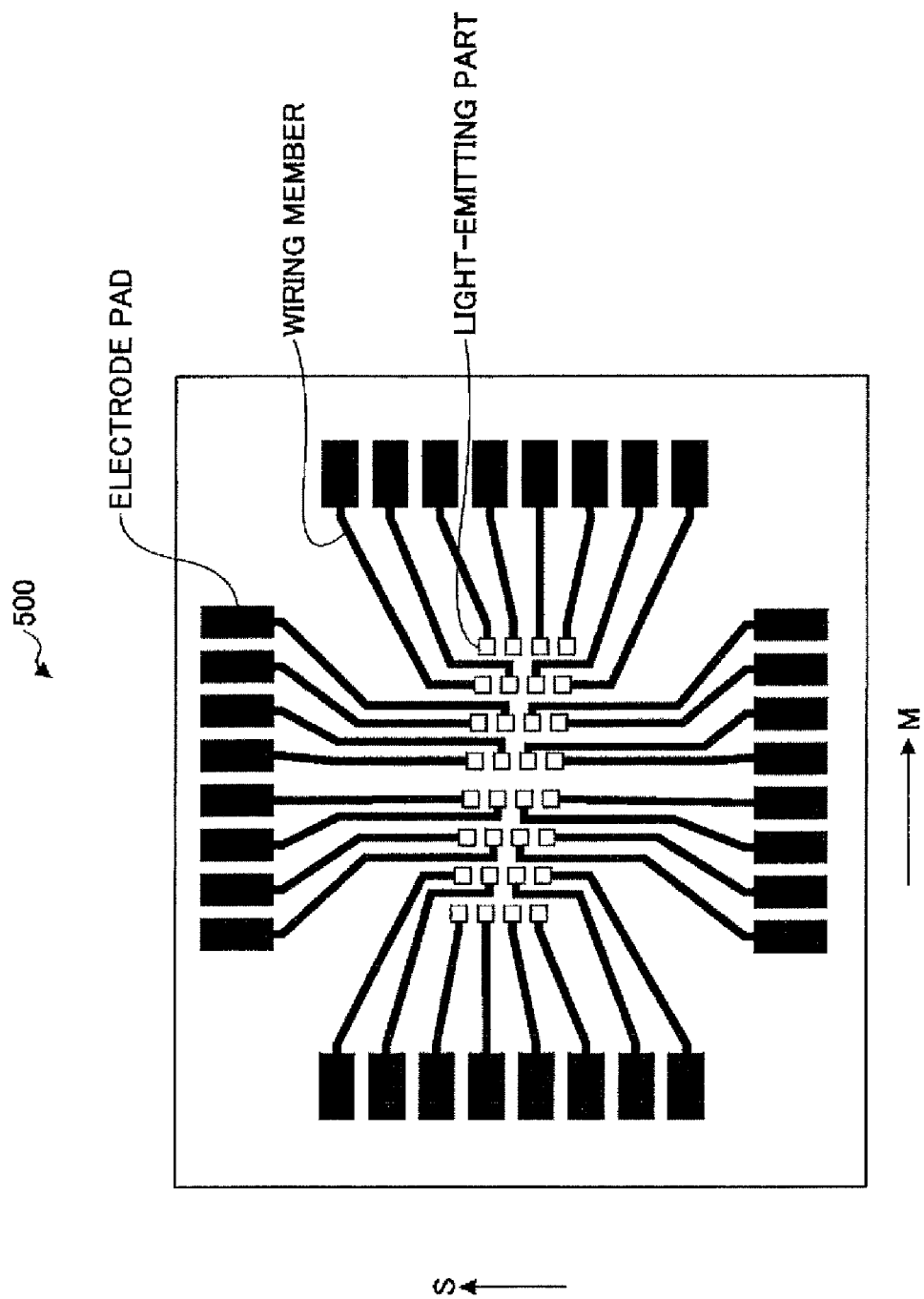
FIG. 30 is a diagram for explaining a surface-emitting laser array.

Further, in the embodiment described above, instead of the surface-emitting laser device 100, the light source 14 may have a surface-emitting laser array 500 shown in FIG. 30 as an example manufactured in the same manner as the surface-emitting laser device 100.

The surface-emitting laser array 500 has plural (32 pieces of) light-emitting parts two-dimensionally arranged on the same substrate. In FIG. 30, an M direction indicates the main scanning direction, and an S direction indicates the sub-scanning direction. Note that the number of the light-emitting parts is not limited to 32.

The plural (32 pieces of) light-emitting parts are arranged such that an interval between the light-emitting parts becomes an equal interval c when all the light-emitting parts are orthogonally projected on an imaginary line extending in the S direction. Note that in this specification, the "interval between the light-emitting parts" refers to a distance between the centers of two light-emitting parts.

Here, the interval c is 3 µm, the interval d between the light-emitting parts in the S direction (see FIG. 31) is 24 µm, and an interval X between the light-emitting parts in the M direction is 30 µm.

Figure 31:
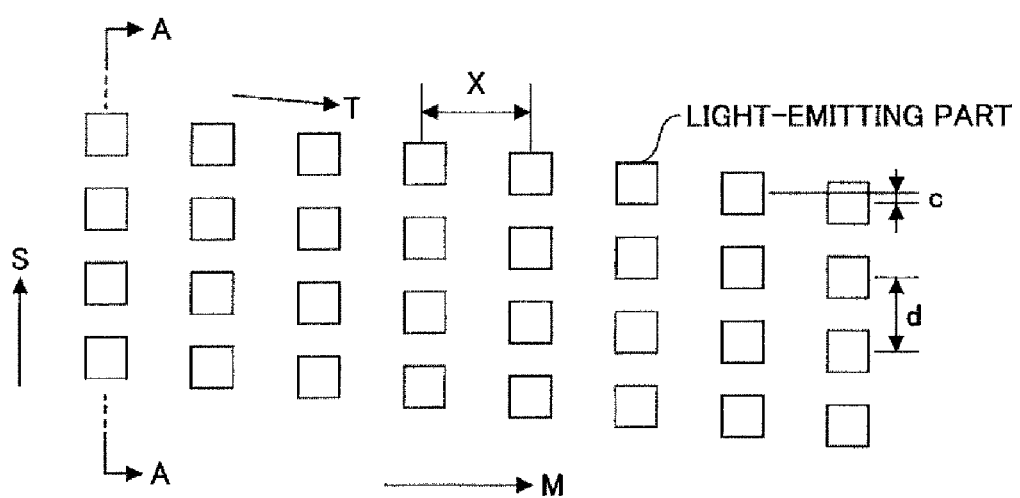
FIG. 31 is a diagram for explaining the two-dimensional arrangement of light-emitting parts shown in FIG. 30.
Figure 32:
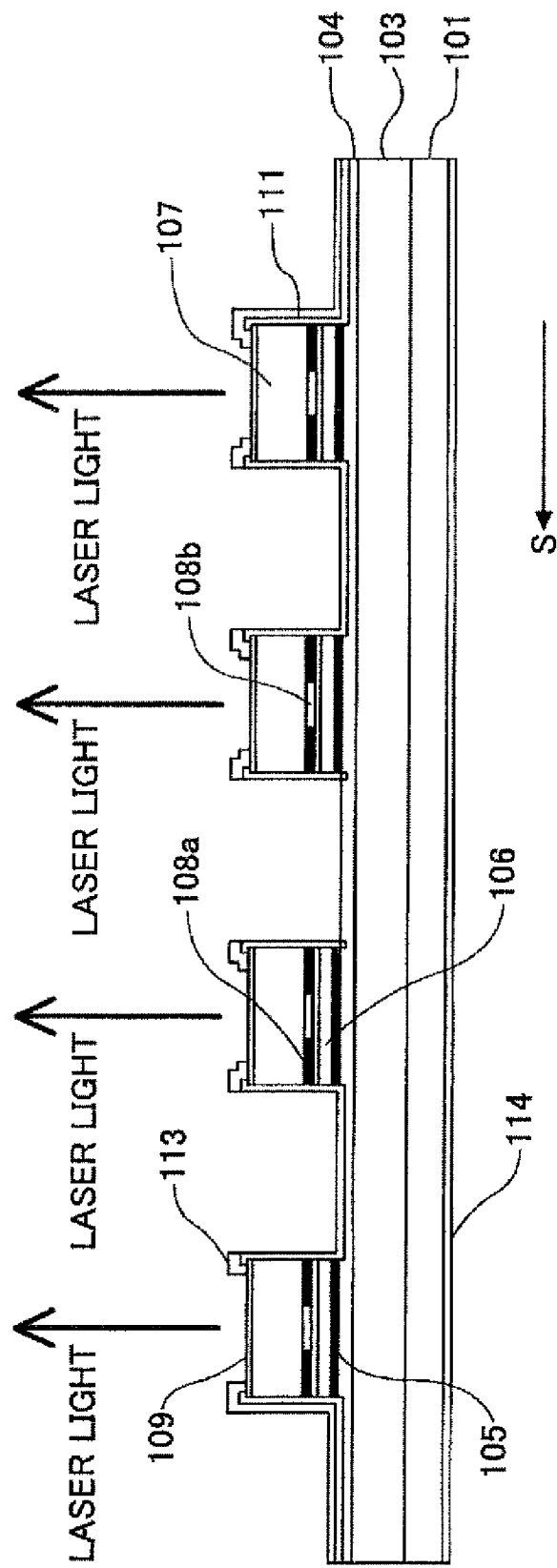
FIG. 32 is a cross-sectional view taken along the line A-A in FIG. 31.

As shown in FIG. 32 which is a cross-sectional view taken along the line A-A in FIG. 31, each of the light-emitting parts has the same structure as that of the surface-emitting laser device 100. In other words, the surface-emitting laser array 500 is a surface-emitting laser array obtained by integrating the surface-emitting laser devices 100. Therefore, the surface-emitting laser array 500 can obtain the same effects as those of the surface-emitting laser device 100.

In this case, in the surface-emitting laser array 500, the interval c between the light-emitting parts becomes equal when all the light-emitting parts are orthogonally projected onto an imaginary line extending in the sub-scanning corresponding direction. Therefore, with the adjustment of the timing of lighting of the light-emitting parts, it can be recognized as a configuration in which the light-emitting parts are arranged at equal interval in the sub-scanning direction on the photosensitive drum 1030.

Further, as described above, the interval c is 3 µm. Therefore, if the magnification of the optical system of the optical scanner 1010 is about 1.8, high-density writing at 4800 dpi (dot per inch) can be realized. Of course, if the number of the light-emitting parts in the main-scanning corresponding direction is increased, or if the surface-emitting laser arrays are arranged such that the interval d is narrowed to further narrow the interval c, or if the magnification of the optical system is reduced, more high-density and more high-quality printing can be made possible. Note that a writing interval in the main scanning direction can be easily controlled by the adjustment of timing of lighting of the light-emitting parts.

In this case, the laser printer 1000 can perform printing without losing its printing speed even if writing dot density is increased. Moreover, the laser printer 1000 can further increase its printing speed if the writing dot density remains the same.

Meanwhile, a groove between the adjacent light-emitting parts is preferably equal to or greater than 5 µm for the purpose of electrically and spatially separating the light-emitting parts from each other. This is because if the gap is too narrow, it becomes hard to control an etching operation at the time of manufacturing the surface-emitting laser array. Further, the size (length of one side) of the mesas is preferably equal to or greater than 10 µm. This is because if the size is too small, heat may persist at the time of operating the surface-emitting laser array and the characteristics of the surface-emitting laser array may degrade.

Further, in the embodiment described above, instead of the surface-emitting laser device 100, a surface-emitting laser array may be used which is manufactured in the same manner as the surface-emitting laser device 100 and in which the same light-emitting parts as those of the surface-emitting laser device 100 are one-dimensionally arranged.

Further, in the embodiment described above, the laser printer 1000 is used as the image forming apparatus. However, the image forming apparatus is not limited to the laser printer 1000. In other words, an image forming apparatus having the optical scanner 1010 only is acceptable.

For example, an image forming apparatus may be used which directly applies laser light to a medium (such as a sheet) that develops a color with laser light.

Further, an image forming apparatus, which uses a silver halide film as an image carrier, may be used. In this case, a latent image is formed on the silver halide film by optical scanning. The formed latent image can be visualized by processing equivalent to development processing in a general silver halide photography process. Then, the latent image can be transferred to a printing sheet by processing equivalent to baking processing in the general silver halide photography process. Such an image forming apparatus can be implemented as a light plate-making apparatus and a light drawing apparatus that draws a CT-scanning image or the like.

Figure 33:
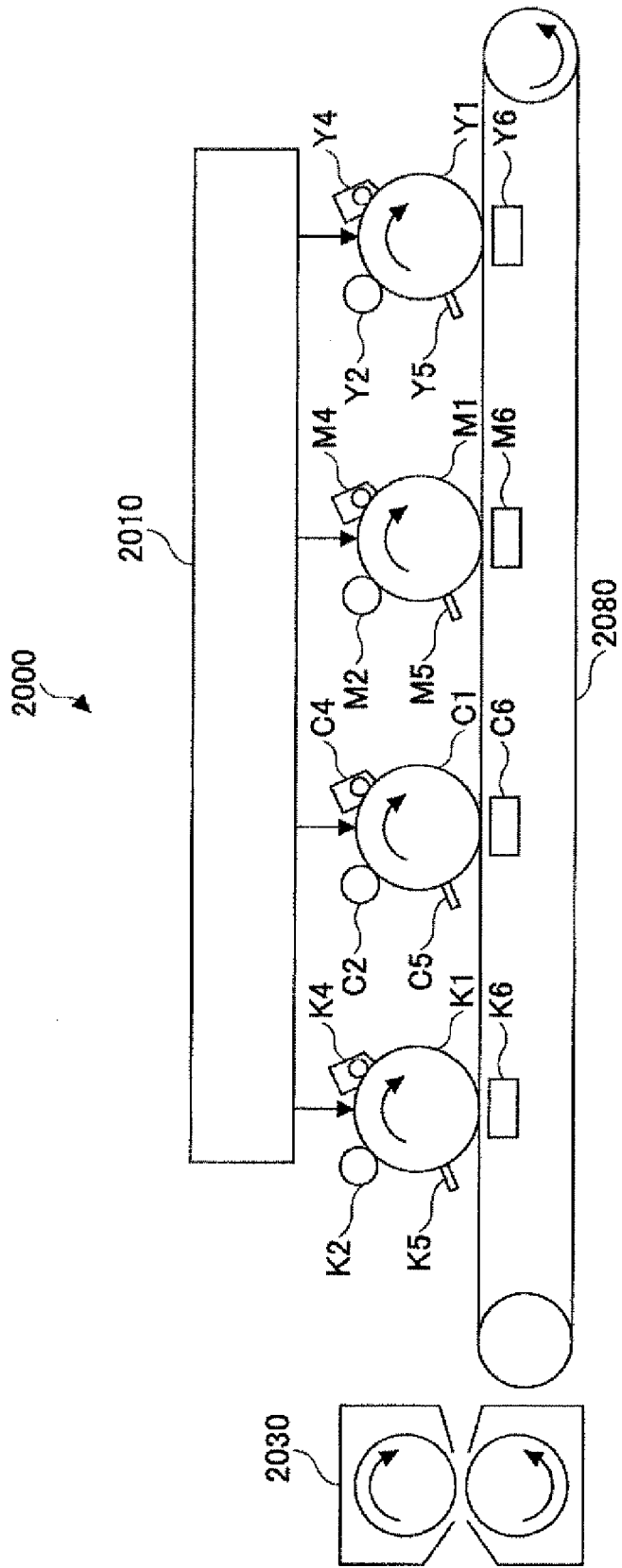
FIG. 33 is a diagram for explaining the schematic configuration of a color printer.

Further, as shown in FIG. 33 as an example, a color printer 2000 having plural photosensitive drums may be used.

The color printer 2000 is a tandem-type multicolor printer that forms a full-color image by superposing four colors (black, cyan, magenta, and yellow) one on another. The color printer 2000 has components for black consisting of a photosensitive drum K1, a charging unit K2, a developing unit K4, a cleaning unit K5, and a transfer unit K6; components for cyan consisting of a photosensitive drum C1, a charging unit C2, a developing unit C4, a cleaning unit C5, and a transfer unit C6; components for magenta consisting of a photosensitive drum M1, a charging unit M2, a developing unit M4, a cleaning unit M5, and a transfer unit M6; components for yellow consisting of a photosensitive drum Y1, a charging unit Y2, a developing unit Y4, a cleaning unit Y5, and a transfer unit Y6; an optical scanner 2010; a transfer belt 2080; a fixing unit 2030; and the like.

The photosensitive drums rotate in the direction as indicated by the arrows in FIG. 27. At the periphery of each of the photosensitive drums, the charging unit, the developing unit, the transfer unit, and the cleaning unit are arranged in a rotating order. The charging units uniformly charge the front surface of the corresponding photosensitive drums. The optical scanner 2010 applies light to the charged front surface of each of the photosensitive drums to form a latent image on each of the photosensitive drums. Then, a toner image is formed on the front surface of each of the photosensitive drums by the corresponding developing unit. Moreover, the toner images in each of the colors are transferred to a recording sheet on the transfer belt 2080 by the corresponding transfer units. Finally, an image is fixed to the recording sheet by the fixing unit 2030.

The optical scanner 2010 has the same light source as the light source 14 for each color. Therefore, the optical scanner 2010 can obtain the same effects as those of the optical scanner 1010. Further, with the provision of the optical scanner 2010, the color printer 2000 can obtain the same effects as those of the laser printer 1000.

Meanwhile, in the color printer 2000, a color shift may occur due to a manufacturing error, a positional error, or the like of the components. Even in this case, since each of the light sources of the optical scanner 2010 has the same surface-emitting laser array as the surface-emitting laser array 500, the color printer 2000 can reduce the color shift by selecting the light-emitting parts to be lighted.

As described above, the method for manufacturing the surface-emitting laser device according to the embodiment of the present invention is suitable for improving the manufacturing yield. Further, the optical scanner according to the embodiment of the present invention is suitable for performing high-precision optical scanning without incurring high cost. Further, the image forming apparatus according to the embodiment of the present invention is suitable for forming a high-quality image without incurring high cost. Further, the oxidation apparatus according to the embodiment of the present invention is suitable for reducing variations in the degree of oxidation.

The present invention is not limited to the specifically disclosed embodiments, and variations and modifications may be made without departing from the scope of the present invention.

The present application is based on Japanese Priority Application Nos. 2009-137792 filed on Jun. 9, 2009, and 2010-026030 filed on Feb. 9, 2010, the entire contents of which are hereby incorporated herein by reference.

What is claimed is:

1. A method for manufacturing a surface-emitting laser device that emits laser light in a direction perpendicular to a substrate, the method comprising:
    manufacturing a laminated body in which a lower reflecting mirror, a resonator structure including an active layer, and an upper reflecting mirror including a to-be-selectively-oxidized layer are laminated on the substrate;
    etching the laminated body from an upper surface thereof to form a mesa structure having at least the to-be-selectively-oxidized layer exposed at a side surface thereof; and
    mounting the laminated body on a tray having a front surface thereof shaped to follow a warpage of the laminated body at an oxidation temperature and selectively oxidizing at the oxidation temperature the to-be-selectively-oxidized layer from the side surface of the mesa structure, thereby generating a confinement structure in which a current passing region is surrounded by an oxide.

2. The method according to claim 1, wherein
the tray is in point-contact with the laminated body to support the laminated body at three or more points.

3. The method according to claim 2, wherein
an interval between the front surface of the tray and the laminated body is uniform except for the points at which the tray is in point-contact with the laminated body.

4. The method according to claim 2, wherein
the front surface of the tray is formed into a convex surface except for the points at which the tray is in point-contact with the laminated body.

5. The method according to claim 4, wherein
the front surface of the tray has a different curvature radius depending on a direction from a central part of the tray to a peripheral surface thereof except for the points at which the tray is in point-contact with the laminated body.

6. The method according to claim 2, wherein
the front surface of the tray has a multiple-stage shape elevated in a stepwise manner from a peripheral part of the tray to a central part thereof except for the points at which the tray is in point-contact with the laminated body.

7. The method according to claim 6, wherein
a step height is different depending on a direction from the central part of the tray to the peripheral part thereof except for the points at which the tray is in point-contact with the laminated body.

* * * * *